United States Patent
Regan et al.

(10) Patent No.: US 10,393,512 B2
(45) Date of Patent: *Aug. 27, 2019

(54) AUTOMATED 3-D MODELING OF SHOE PARTS

(71) Applicant: NIKE, Inc., Beaverton, OR (US)

(72) Inventors: Patrick C. Regan, Taichung (TW);
Chih-Chi Chang, Taichung (TW);
Kuo-Hung Lee, Douliu (TW);
Ming-Feng Jean, Yunlin County (TW)

(73) Assignee: NIKE, Inc., Beaverton, OR (US)

( * ) Notice: Subject to any disclaimer, the term of this patent is extended or adjusted under 35 U.S.C. 154(b) by 777 days.

This patent is subject to a terminal disclaimer.

(21) Appl. No.: 14/468,521

(22) Filed: Aug. 26, 2014

(65) Prior Publication Data

US 2014/0362079 A1 Dec. 11, 2014

Related U.S. Application Data

(63) Continuation of application No. 13/299,827, filed on Nov. 18, 2011, now Pat. No. 8,849,620.

(51) Int. Cl.
*A43D 1/08* (2006.01)
*G06T 17/00* (2006.01)
(Continued)

(52) U.S. Cl.
CPC ............ *G01B 11/24* (2013.01); *A43D 1/08* (2013.01); *A43D 8/00* (2013.01); *A43D 25/06* (2013.01);
(Continued)

(58) Field of Classification Search
None
See application file for complete search history.

(56) References Cited

U.S. PATENT DOCUMENTS

| | | | | |
|---|---|---|---|---|
| 4,010,502 A | * | 3/1977 | Cushing | A43D 8/36 |
| | | | | 12/86.7 |
| 4,041,620 A | | 8/1977 | Anderson | |

(Continued)

FOREIGN PATENT DOCUMENTS

| | | |
|---|---|---|
| CA | 2790521 A1 | 9/2011 |
| CA | 2791913 A1 | 9/2011 |

(Continued)

OTHER PUBLICATIONS

Y. Jin, L. Zhang, C. Wu, and Z. Zho, "Detection of 3D Curve for Shoe Sole Spraying Based on Laser Triangulation Measurement" IEEE 2009, pp. 865-868.*

(Continued)

*Primary Examiner* — Kibrom K Gebresilassie
(74) *Attorney, Agent, or Firm* — Shook, Hardy & Bacon L.L.P.

(57) ABSTRACT

Manufacturing of a shoe is enhanced by creating 3-D models of shoe parts. For example, a laser beam may be projected onto a shoe-part surface, such that a projected laser line appears on the shoe part. An image of the projected laser line may be analyzed to determine coordinate information, which may be converted into geometric coordinate values usable to create a 3-D model of the shoe part. Once a 3-D model is known and is converted to a coordinate system recognized by shoe-manufacturing tools, certain manufacturing steps may be automated.

25 Claims, 10 Drawing Sheets

(51) Int. Cl.

| | | |
|---|---|---|
| *G01B 11/24* | (2006.01) | |
| *G06F 17/50* | (2006.01) | |
| *A43D 8/00* | (2006.01) | |
| *A43D 25/06* | (2006.01) | |
| *G06T 7/521* | (2017.01) | |
| *G01B 11/25* | (2006.01) | |
| *G01B 11/02* | (2006.01) | |
| *G01B 11/03* | (2006.01) | |
| *A43D 95/00* | (2006.01) | |
| *G06T 19/00* | (2011.01) | |
| *G06T 7/543* | (2017.01) | |
| *B25J 9/16* | (2006.01) | |

(52) U.S. Cl.
CPC .............. *G06F 17/50* (2013.01); *G06T 7/521*
(2017.01); *G06T 17/00* (2013.01); *A43D 95/00*
(2013.01); *A43D 2200/60* (2013.01); *B25J
9/1684* (2013.01); *G01B 11/02* (2013.01);
*G01B 11/03* (2013.01); *G01B 11/2518*
(2013.01); *G05B 2219/37205* (2013.01); *G05B
2219/37555* (2013.01); *G05B 2219/39393*
(2013.01); *G06T 7/543* (2017.01); *G06T 19/00*
(2013.01); *G06T 2207/10016* (2013.01); *G06T
2207/10028* (2013.01); *G06T 2207/10144*
(2013.01); *G06T 2207/30108* (2013.01)

(56) References Cited

U.S. PATENT DOCUMENTS

| | | | |
|---|---|---|---|
| 4,304,020 A | 12/1981 | Bonnet et al. | |
| 4,452,057 A * | 6/1984 | Davies | A43D 119/00 69/6.5 |
| 4,639,963 A * | 2/1987 | Fisher | A43D 25/00 12/1 A |
| 4,671,755 A | 6/1987 | Graee | |
| 4,765,011 A * | 8/1988 | Leeper | A43D 111/00 12/1 A |
| 4,803,735 A | 2/1989 | Nishida et al. | |
| 4,866,802 A | 9/1989 | Stein | |
| 4,996,012 A | 2/1991 | Gierschewski et al. | |
| 5,027,281 A | 6/1991 | Rekow et al. | |
| 5,083,518 A * | 1/1992 | Ciucani | A43D 44/00 112/35 |
| 5,098,313 A | 3/1992 | Marsh et al. | |
| 5,105,564 A | 4/1992 | Motoda | |
| 5,148,591 A | 9/1992 | Pryor | |
| 5,218,427 A | 6/1993 | Koch | |
| 5,231,470 A | 7/1993 | Koch | |
| 5,255,352 A | 10/1993 | Falk | |
| 5,259,468 A | 11/1993 | Warren et al. | |
| 5,377,011 A | 12/1994 | Koch | |
| 5,506,682 A | 4/1996 | Pryor | |
| 5,608,847 A | 3/1997 | Pryor | |
| 5,671,055 A | 9/1997 | Whittlesey et al. | |
| 5,768,732 A | 6/1998 | Blanc | |
| 5,784,737 A | 7/1998 | Tsuji et al. | |
| 5,807,449 A * | 9/1998 | Hooker | A43D 25/183 118/680 |
| 5,819,016 A * | 10/1998 | Watanabe | G01B 11/002 345/419 |
| 5,836,428 A | 11/1998 | Young | |
| 5,920,395 A | 7/1999 | Schulz et al. | |
| 6,009,359 A * | 12/1999 | El-Hakim | G01C 11/02 348/135 |
| 6,051,028 A * | 4/2000 | McCartney | A43D 1/04 703/2 |
| 6,301,763 B1 | 10/2001 | Pryor | |
| 6,438,780 B1 | 8/2002 | Hansen et al. | |
| 6,473,667 B1 * | 10/2002 | Lee | A43D 3/02 700/118 |
| 6,533,885 B2 | 3/2003 | Davis et al. | |
| 6,599,381 B2 | 7/2003 | Urlaub et al. | |
| 6,611,617 B1 | 8/2003 | Crampton | |
| 6,721,444 B1 | 4/2004 | Gu et al. | |
| 6,765,572 B2 | 7/2004 | Roelofs | |
| 6,779,032 B1 | 8/2004 | Hericourt | |
| 6,816,755 B2 * | 11/2004 | Habibi | B25J 9/1697 318/568.11 |
| 6,867,772 B2 | 3/2005 | Kotcheff et al. | |
| 6,900,450 B2 | 5/2005 | Gimenez et al. | |
| 6,952,204 B2 | 10/2005 | Baumberg et al. | |
| 7,065,242 B2 | 6/2006 | Petrov et al. | |
| 7,079,114 B1 * | 7/2006 | Smith | G06F 3/0304 345/156 |
| 7,204,043 B2 | 4/2007 | Kilgore | |
| 7,446,733 B1 | 11/2008 | Hirimai | |
| 7,620,235 B2 * | 11/2009 | Daniel | G01B 11/2518 345/426 |
| 7,657,100 B2 | 2/2010 | Gokturk et al. | |
| 7,881,896 B2 * | 2/2011 | Atwell | B25J 9/1692 702/150 |
| 8,005,558 B2 | 8/2011 | Waatti et al. | |
| 8,035,052 B2 | 10/2011 | De La Ballina et al. | |
| 8,107,721 B2 | 1/2012 | Beardsley et al. | |
| 8,143,494 B2 | 3/2012 | Eby | |
| 8,220,335 B2 | 7/2012 | Dubois et al. | |
| 8,233,667 B2 | 7/2012 | Helgason et al. | |
| 8,545,743 B2 | 10/2013 | Spanks et al. | |
| 8,849,620 B2 * | 9/2014 | Regan | G06F 17/50 703/1 |
| 8,966,775 B2 | 3/2015 | Regan et al. | |
| 9,237,780 B2 | 1/2016 | Jurkovic et al. | |
| 9,339,079 B2 | 5/2016 | Lucas et al. | |
| 9,451,810 B2 * | 9/2016 | Regan | B25J 15/0608 |
| 9,668,545 B2 | 6/2017 | Jurkovic et al. | |
| 10,194,716 B2 * | 2/2019 | Regan | A43D 11/00 |
| 2001/0010249 A1 | 8/2001 | McNichols | |
| 2001/0042321 A1 | 11/2001 | Tawney et al. | |
| 2002/0024677 A1 | 2/2002 | Metcalfe | |
| 2002/0193909 A1 | 12/2002 | Parker et al. | |
| 2003/0038822 A1 * | 2/2003 | Raskar | G01B 11/2504 345/632 |
| 2003/0062110 A1 | 4/2003 | Urlaub et al. | |
| 2003/0139848 A1 | 7/2003 | Cifra et al. | |
| 2003/0231793 A1 * | 12/2003 | Crampton | G01B 11/2518 382/154 |
| 2003/0231797 A1 * | 12/2003 | Cullen | G06T 9/005 382/239 |
| 2004/0022426 A1 | 2/2004 | Carbone, II et al. | |
| 2004/0172164 A1 | 9/2004 | Habibi et al. | |
| 2005/0135670 A1 * | 6/2005 | Vaidyanathan | G06T 17/10 382/154 |
| 2005/0154485 A1 | 7/2005 | Popp et al. | |
| 2006/0041448 A1 | 2/2006 | Patterson et al. | |
| 2006/0143839 A1 * | 7/2006 | Fromme | A43B 7/00 12/142 R |
| 2006/0155417 A1 * | 7/2006 | Cremaschi | A43D 3/02 700/182 |
| 2006/0221072 A1 * | 10/2006 | Se | G01C 11/06 345/420 |
| 2006/0266593 A1 | 11/2006 | Cerreto et al. | |
| 2008/0139126 A1 | 6/2008 | Lee et al. | |
| 2008/0147219 A1 | 6/2008 | Jones et al. | |
| 2008/0189194 A1 * | 8/2008 | Bentvelzen | A43B 3/24 705/26.5 |
| 2008/0192263 A1 | 8/2008 | Wienand et al. | |
| 2010/0036753 A1 | 2/2010 | Harvill et al. | |
| 2010/0149178 A1 * | 6/2010 | Yokoyama | G06T 19/00 345/419 |
| 2010/0238271 A1 * | 9/2010 | Pfeiffer | A43D 1/06 348/46 |
| 2010/0243030 A1 | 9/2010 | Yago | |
| 2011/0000299 A1 | 1/2011 | Isobe et al. | |
| 2011/0061265 A1 | 3/2011 | Lyden | |
| 2011/0166694 A1 | 7/2011 | Griffits et al. | |
| 2011/0172797 A1 * | 7/2011 | Jones | A43B 1/0054 700/98 |
| 2011/0232008 A1 * | 9/2011 | Crisp | A43B 9/00 12/18.1 |
| 2011/0264138 A1 | 10/2011 | Avelar et al. | |

(56) References Cited

U.S. PATENT DOCUMENTS

| | | | |
|---|---|---|---|
| 2011/0292406 A1* | 12/2011 | Hollenbeck | G01B 11/2518 356/607 |
| 2012/0059517 A1 | 3/2012 | Nomura | |
| 2012/0287253 A1 | 11/2012 | Makover | |
| 2013/0004289 A1* | 1/2013 | Gaudette | B65G 47/904 414/807 |
| 2013/0030773 A1* | 1/2013 | O'Hare | G06F 17/50 703/1 |
| 2013/0111731 A1 | 5/2013 | Onishi | |
| 2013/0125319 A1* | 5/2013 | Regan | A43D 11/00 12/142 R |
| 2013/0131854 A1 | 5/2013 | Regan et al. | |
| 2013/0131865 A1 | 5/2013 | Yamane | |
| 2013/0132038 A1* | 5/2013 | Regan | G06F 17/50 703/1 |
| 2014/0081441 A1* | 3/2014 | Regan | G05B 19/4093 700/98 |
| 2014/0096403 A1* | 4/2014 | Regan | A43D 25/18 33/6 |
| 2014/0196307 A1 | 7/2014 | Fremming et al. | |
| 2015/0135447 A1* | 5/2015 | Jurkovic | A43D 8/16 12/51 |
| 2017/0105490 A1* | 4/2017 | Makover | A43D 111/00 |
| 2017/0308066 A1* | 10/2017 | Farren | G05B 19/4187 |
| 2018/0129185 A1* | 5/2018 | Jurkovic | G05B 19/41805 |

FOREIGN PATENT DOCUMENTS

| | | |
|---|---|---|
| CN | 8510814 A | 4/1986 |
| CN | 1293752 A | 5/2001 |
| CN | 1505997 A | 6/2004 |
| CN | 1753611 A | 3/2006 |
| CN | 1831687 A | 9/2006 |
| CN | 2865565 Y | 2/2007 |
| CN | 101161151 A | 4/2008 |
| CN | 101339640 A | 1/2009 |
| CN | 201349600 A | 11/2009 |
| CN | 101847173 A | 9/2010 |
| CN | 102076269 A | 5/2011 |
| CN | 102157013 A | 8/2011 |
| DE | 4020538 C1 | 8/1991 |
| DE | 10343620 A1 | 4/2005 |
| EP | 0123173 A2 | 3/1988 |
| EP | 348311 A1 | 12/1989 |
| EP | 0512773 A1 | 11/1992 |
| EP | 0572123 A2 | 12/1993 |
| EP | 610610 A1 | 8/1994 |
| EP | 0689778 A1 | 1/1996 |
| EP | 0422946 B1 | 6/1996 |
| EP | 0790010 A1 | 4/2001 |
| EP | 0840880 B1 | 3/2002 |
| EP | 1544800 A2 | 6/2005 |
| ES | 2142239 A | 4/2000 |
| FR | 2911255 A1 | 7/2008 |
| GB | 699299 A | 11/1953 |
| GB | 2140345 A | 11/1984 |
| JP | H06198523 A | 7/1994 |
| JP | 2002217251 A | 8/2002 |
| JP | 2011143497 A | 7/2011 |
| KR | 100656743 B1 | 12/2006 |
| TW | 486614 B | 5/2002 |
| TW | 201017092 A | 5/2010 |
| TW | 201128569 A | 8/2011 |
| WO | 9111885 A1 | 8/1991 |
| WO | 9727451 A1 | 7/1997 |
| WO | 99055186 A1 | 11/1999 |
| WO | 0036943 A1 | 6/2000 |
| WO | 2008044943 A1 | 4/2008 |
| WO | 2010014750 A1 | 2/2010 |
| WO | 2010034044 A2 | 4/2010 |

OTHER PUBLICATIONS

Y. Y Jin, L. L Zhang, C. Wu, and Z. Zho, "Detection of 3D Curve for Shoe Sole Spraying Based on Laser Triangulation Measurement" IEEE 2009, pp. 865-868.*
European Office Action dated Oct. 24, 2016 in European Patent Application No. 12850527.8, 5 pages.
International Search Report with Written Opinion of the International Searching Authority in PCT/US12/65572, dated Feb. 5, 2013, 10 pages.
Notice of Allowance and Fee(s) Due in U.S. Appl. No. 13/299,872 dated Feb. 3, 2014, 10 pages.
Jin et al., Detection of 3D Curve for Shoe Sole Spraying Based on Laser Triangulation Measurement, Proc. IEEE Int. Conf. on Auto. and Log., Shenyang, China, Aug. 2009, 4 pages.
Notice of Allowance and Fee(s) Due in U.S. Appl. No. 13/299,827 dated Jun. 19, 2014, 7 pages.
Non-Final Office Action in U.S. Appl. No. 13/299,827 dated Jan. 13, 2014, 21 pages.
Notice of Allowance dated May 24, 2016 in U.S. Appl. No. 13/299,856, 15 pages.
International Search Report with Written Opinion dated Jan. 29, 2013 in Application No. PCT/US12/65516, 8 pages.
International Search Report with Written Opinion dated Feb. 8, 2013 in Application No. PCT/US12/65542, 10 pages.
Non-Final Office Action dated Jun. 3, 2014 in U.S. Appl. No. 13/299,819, 21 pages.
Non-Final Office Action dated Jul. 7, 2014 in U.S. Appl. No. 13/299,856, 17 pages.
Notice of Allowance dated Oct. 2, 2014 in U.S. Appl. No. 13/299,819, 9 pages.
Final Office Action dated Dec. 4, 2014 in U.S. Appl. No. 13/299,856, 23 pages.
Partial Supplementary European Search Report dated Jul. 24, 2015 in Application No. EP12850527.8, 7 pages.
Non-Final Office Action dated Jun. 17, 2015 in U.S. Appl. No. 13/299,856, 13 pages.
International Preliminary Report on Patentability dated Jun. 2, 2016 for PCT Application No. PCT/US2014/059929, 8 pages.
International Search Report with Written Opinion dated Jan. 30, 2015 in PCT Application No. PCT/US2014/059929, 92 pages.
European Extended Search Report dated Mar. 15, 2016 in Application No. 15003012.0, 9 pages.
European Extended Search Report dated Mar. 14, 2016 in Application No. 15002942.9, 8 pages.
European Extended Search Report dated Nov. 13, 2015 in Application No. 12850527.8, 11 pages.
Final Office Action dated Dec. 17, 2015 in U.S. Appl. No. 13/299,856, 12 pages.
European Extended Search Report dated Sep. 18, 2015 in Application No. 12850224.2, 9 pages.
European Extended Search Report dated Oct. 13, 2015 in Application No. 12849307.9, 9 pages.
European Extended Search Report dated Oct. 27, 2015 in Application No. 12849978.7, 6 pages.
Non-Final Office Action dated Feb. 6, 2015 in U.S. Appl. No. 14/267,503, 10 pages.
Notice of Allowance dated Mar. 16, 2015 in U.S. Appl. No. 14/267,503, 6 pages.
Final Office Action dated Apr. 21, 2017 in U.S. Appl. No. 14/084,365, 15 pages.
Non-Final Office Action dated Jun. 5, 2017 in U.S. Appl. No. 14/803,347, 10 pages.
Final Office Action dated Jul. 11, 2017 in U.S. Appl. No. 14/586,575, 6 pages.
Non-Final Office Action dated Dec. 30, 2016 in U.S. Appl. No. 14/084,365, 12 pages.
Non-Final Office Action dated Jan. 3, 2017 in U.S. Appl. No. 14/586,575, 8 pages.
Zhongxu Hu et al, Computer vision for shoe upper profile measurement via upper and sole conformal matching, Optics and Lasers in Engineering 45 (2007) 183-190.

(56) References Cited

OTHER PUBLICATIONS

European Office Action dated Feb. 24, 2017 in European Patent Application No. 12847978.7, 5 pages.
Non-Final Office Action dated Sep. 28, 2017 in U.S. Appl. No. 14/084,365, 18 pages.
Notice of Allowance dated Dec. 7, 2017 in U.S. Appl. No. 14/586,575, 7 pages.
Non-Final Office Action dated Jan. 23, 2018 in U.S. Appl. No. 14/803,347, 6 pages.
European Office Action dated Jul. 12, 2017 in European Patent Application No. 15002942.9, 5 pages.
Non-Final Office Action dated Nov. 16, 2018 in U.S. Appl. No. 15/940,162, 12 pages.
Decision to grant dated Dec. 13, 2018 in European Patent Application No. 15002942.9, 2 pages.
Partial Search Report dated Jan. 23, 2019 in European Patent Application No. 18202180.8, 15 pages.
Extended Search Report dated Mar. 13, 2018 in European Patent Application No. 18000089.5, 12 pages.
Anonymoous: DAVID—User Manual pp. 1-15, Dec. 15, 2009 (Dec. 15, 2009), XP055455777, Retrieved from the Internet: URL:https://web.archive.org/web/20111026052618/http://david-laserscanner.com:80/wiki/user_manual/frequently_asked_questions [retrieved on Mar. 1, 2018].
Anonymous: "David—User Manual Pages—3D Laser Scanning", Feb. 20, 2009 (Feb. 20, 2009), XP055455780, Retrieved from the Internet: URL:https://web.archive.org/web/20111108145812/http://david-laserscanner.com:80/wiki/user_manual/3d_laser_scanning [retrieved on Mar. 1, 2018].
Notice of Allowance dated Sep. 26, 2018 in U.S. Appl. No. 14/803,347, 6 pages.
Extended Search Report dated Jul. 16, 2018 in European Patent Application No. 18000172.9, 10 pages.
Communication pursuant to Article 94(3) EPC dated May 7, 2018 in European Application No. 14786585.1, 4 pages.
Notice of Allowance dated May 18, 2018 in U.S. Appl. No. 14/803,347, 5 pages.
Final Office Action dated Jun. 13, 2018 in U.S. Appl. No. 14/084,365, 23 pages.
Extended European Search Report dated Jun. 25, 2018 in European Application No. 18000271.9, 9 pages.
Office Action dated Jul. 5 in U.S. Appl. No. 15/209,323, 38 pages.
Communication under Rule 71(3) dated Feb. 5, 2019 in European Patent Application No. 14786585.1, 7 pages.
Communication pursuant to Article 94(3) dated Mar. 22, 2019 in European Patent Application No. 18000271.9, 6 pages.
Final Office Action dated Apr. 4, 2019 in U.S. Appl. No. 15/209,323, 31 pages.
Final Office Action dated Apr. 22, 2019 in U.S. Appl. No. 15/940,162, 13 pages.
Nemec et al, "Automation of Lasting Operation in Shoe Production Industry", 2003, pp. 462-465, downloaded from the Internet: https://ieeexplore.ieee.org/stamp/stamp.jsp?tp=&arnumber=1290363 (Year: 2003).
Nemec et al, "Automation in Shoe Assembly", 2006, pp. 5. downloaded from the Internet: http://conf.uni-obuda.hu/raad2006Nemec.pdf (Year: 2006).
Hu et al, "Automatic surface roughing with 3D machine vision and cooperative robot control", Feb. 15 2007, downloaded from the Internet: https://pdf.sciencedirectassets.com/271599 (Year: 2007).

* cited by examiner

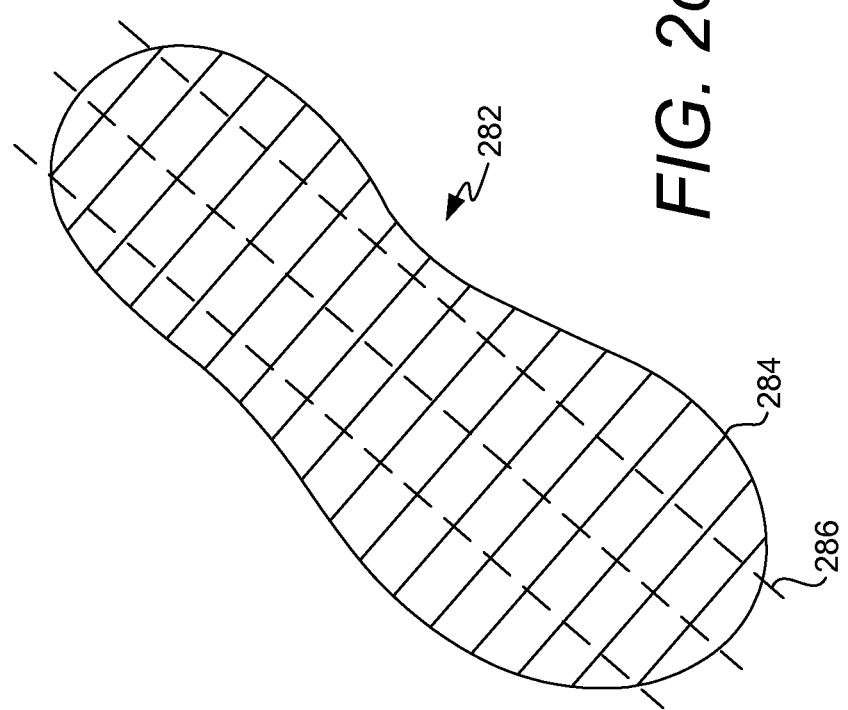

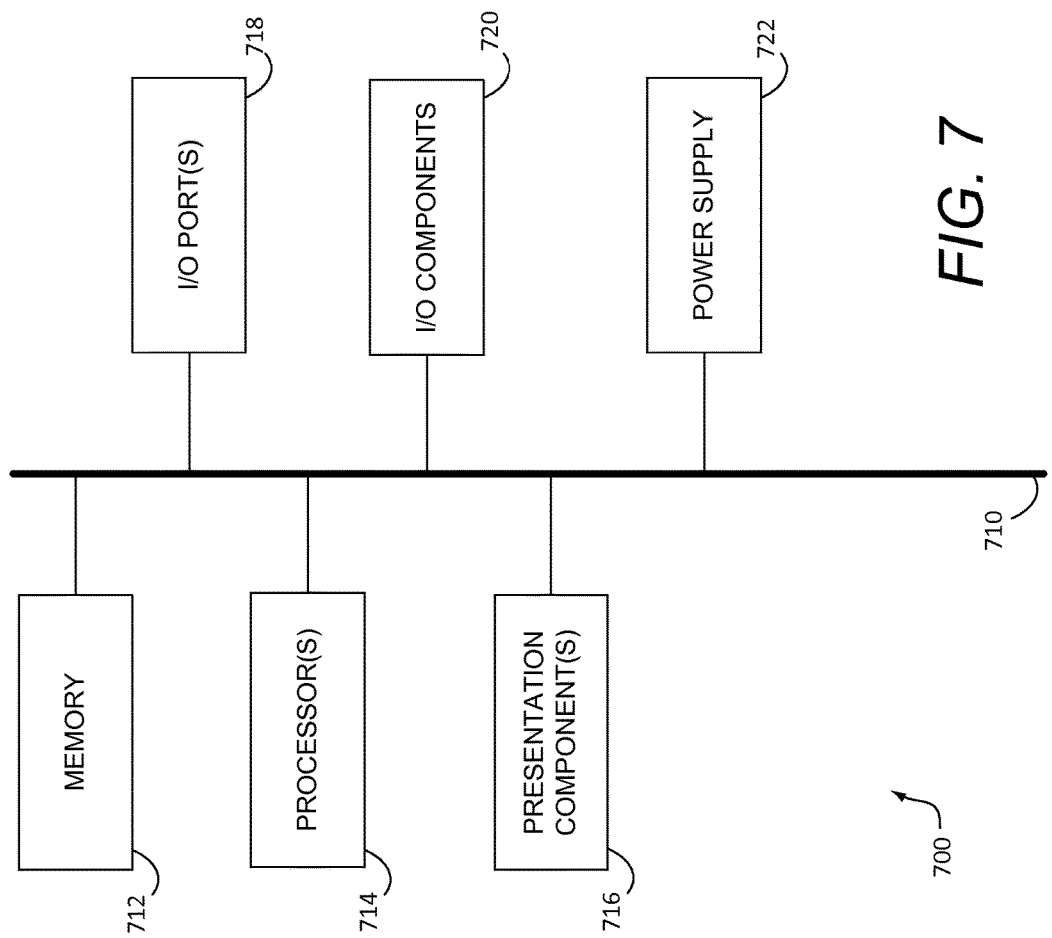

ly, multiple lasers and cameras may be utilized when a surface of a shoe part may be difficult to scan with only one laser and camera. In addition, lasers and cameras may be arranged at various positions respective to the shoe part, such as perpendicular to a shoe part or angled respective to a shoe part.
AUTOMATED 3-D MODELING OF SHOE PARTS

CROSS-REFERENCE TO RELATED APPLICATIONS

This application is a Continuation Application of U.S. application Ser. No. 13/299,827, filed Nov. 18, 2011, Now U.S. Pat. No. 8,849,620, and entitled "AUTOMATED 3-D MODELING OF SHOE PARTS. The entirety of the aforementioned application is incorporated by reference herein.

BACKGROUND

Manufacturing a shoe typically requires manipulation of three-dimensional shoe parts, such as by forming, placing, and assembling the parts. Some methods of completing these steps, such as those that rely heavily on manual execution, may be resource intensive and may have a high rate of variability.

SUMMARY

This high-level overview of various aspects of the invention provides an overview of the disclosure and introduces a selection of concepts that are further described in the detailed-description section below. This summary is not intended to identify key features or essential features of the claimed subject matter, nor is it intended to be used as an aid in isolation to determine the scope of the claimed subject matter.

In brief and at a high level, this disclosure describes, among other things, analyzing scans of a shoe part to generate dimension data, which is useable to model three-dimensional (3-D) features of the shoe part. For example, a laser beam may be projected onto a shoe-part surface, such that a projected laser line appears on the surface and follows a surface contour creating a cross-section of the shoe-part surface. Multiple images of the projected laser line may be combined to create a 3-D model of the shoe part. Once a 3-D model is known and is converted to a coordinate system recognized by, for example, a robot tool path, certain manufacturing steps may be automated.

An exemplary system that analyzes scans of a shoe part to generate dimension data may be comprised of various components, such a shoe-part moving apparatus that retains the shoe part and moves the shoe part through a range of positions (e.g., forward/backward, 360-degree rotation, etc.). In addition, an exemplary system may comprise a laser that projects a laser beam onto a section of the shoe part as the shoe part is moved to a position of the range of positions, such that a projected laser line extends across the section. Another component of an exemplary system may comprise a camera that records multiple images of the projected laser line, each image depicting a representation of the projected laser line extending across the section. Moreover, an exemplary system may comprise computer storage media having stored thereon computer-executable instructions that, when executed by a computing device, enable the computing device to analyze the images depicting the representation.

An exemplary system may be comprised of one or multiple lasers and one or multiple cameras. For example, multiple lasers and cameras may be utilized when a surface of a shoe part may be difficult to scan with only one laser and camera. In addition, lasers and cameras may be arranged at various positions respective to the shoe part, such as perpendicular to a shoe part or angled respective to a shoe part. Further, camera settings (e.g., aperture, shutter speed, etc.) may be varied depending on colors of shoe parts.

An exemplary method for analyzing scans of a shoe part to generate dimension data, which is useable to model three-dimensional (3-D) features of the shoe part, may have various steps. For example, a laser beam may be projected onto a shoe-part surface of the shoe part that is comprised of a surface topography. A projected laser line may extend across a section of the shoe-part surface. In addition, an image may be recorded depicting a representation of the projected laser line, and coordinate points may be determined that define the representation of the line as depicted in the image. The coordinate points may be combined with a plurality of other coordinate points derived from additional images, such that a combination of coordinate points that represent the surface topography are compiled. The combination of coordinate points may be converted into geometric coordinate points that represent a 3-D model of the surface topography.

In another exemplary method, a first shoe part may be attached onto a second shoe part, such that a terminal edge of the first shoe part encircles the second shoe part. A laser beam may be projected onto the first shoe part and the second shoe part, such that a first segment of a projected laser line extends on the first shoe part, and a second segment extends on the second shoe part. An image may be recorded that depicts a first-segment representation and a second-segment representation. An interface region portion between the first-segment representation and a second-segment representation may represent a position of the terminal edge, and a coordinate point of the interface region may be determined. The coordinate point may be converted to a geometric coordinate point of the second shoe part and deemed a position on the second shoe part that is aligned with the terminal edge.

BRIEF DESCRIPTION OF THE DRAWINGS

Illustrative aspects of the present invention are described in detail below with reference to the attached drawing figures, wherein:

FIGS. 2a, 2b, and 2c depict schematic diagrams of exemplary systems for automated 3-D modeling of a shoe bottom in accordance with the present invention;

FIG. 7 depicts a block diagram of an exemplary computing device that may be used with systems and methods in accordance with the present invention.

DETAILED DESCRIPTION

The subject matter of certain aspects of the present invention is described with specificity herein to meet statutory requirements. But the description itself is not intended to define what is regarded as an invention, which is what the claims do. The claimed subject matter may comprise different elements or combinations of elements similar to the ones described in this document, in conjunction with other present or future technologies. Terms should not be interpreted as implying any particular order among or between various elements herein disclosed unless explicitly stated.

Figure 1:
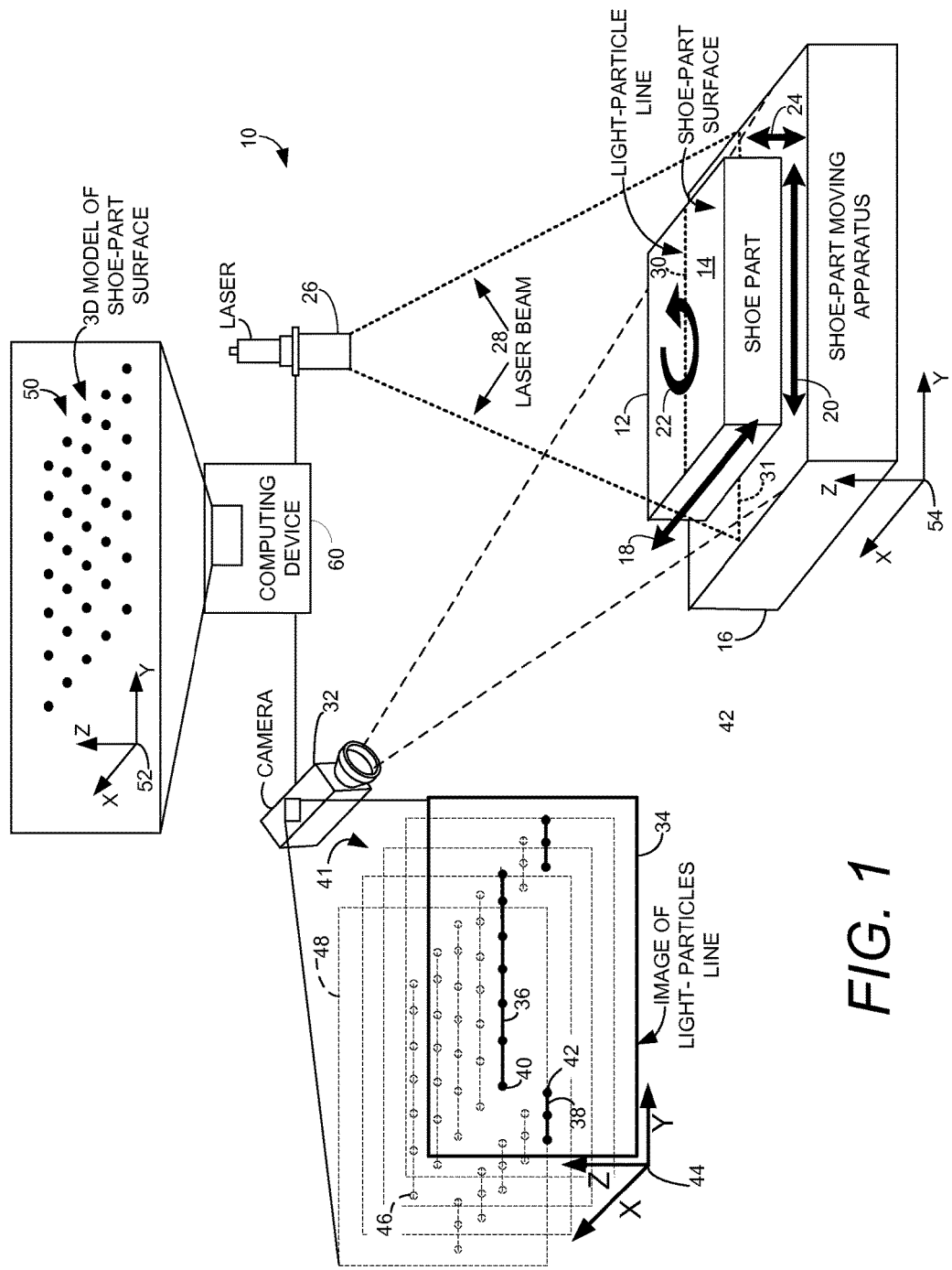
FIG. 1 depicts a schematic diagram of an exemplary system for automated 3-D modeling of shoe parts.

Subject matter described herein relates to automated three-dimensional ("3-D") modeling of a shoe part, and FIG. 1 depicts an exemplary system 10 that may perform various actions to analyze images of shoe part 12. Three-dimensional modeling refers to generation of dimension data that represent 3-D features of the shoe part. For example, dimension data may comprise coordinate points of a 3-D coordinate system, as well as 3-D representations of the shoe part that are renderable using the dimension data. Dimension data may be generated using various techniques, such as by combining data derived from scans or images of a shoe part.

Shoe part 12 of FIG. 1 may be a variety of different shoe parts. That is, although shoe part 12 is generically depicted, shoe part 12 may be, among other things, a shoe outsole, a shoe midsole, a midsole and outsole assembly, a shoe upper (lasted or unlasted shoe upper), a component of a shoe upper, or a combination of shoe parts. As such, shoe part 12 may have a variety of different characteristics, such as size, shape, texture, materials, surface topography, etc. For example, shoe part 12 is comprised of a shoe-part surface 14, which may be comprised of various surface topographies. A surface topography refers to the various contours that comprise shoe-part surface 14. For example, although surface 14 is depicted as flat for illustrative purposes, a surface topography may be comprised of a convex surface, a concave surface, or a combination thereof.

Shoe part 12 may be supported by a shoe-part moving apparatus 16, which may move shoe part 12 through a series of positions. Arrows 18 and 20 illustrates that shoe-part moving apparatus 16 may move shoe part 12 forward and backward, or left and right. For example, shoe-part moving apparatus 16 may comprise a conveyor that supports shoe part 12 on a conveyor belt.

Arrow 22 illustrates that shoe-part moving apparatus 16 may rotate shoe part 12. For example, shoe-part moving apparatus 16 may comprise a servo-motor-driven turntable or other rotating apparatus. Shoe-part moving apparatus 16 may additionally and/or alternatively comprise articulating arms with clamps, chain or belt driven gripping devices, suction tools, ramps, or any other apparatus capable of moving shoe parts. Moreover, arrow 24 illustrates that shoe-part moving apparatus 16 may move shoe part 12 up and down.

System 10 may also comprise a laser 26 that projects a laser beam 28 onto shoe part 12, such as onto surface 14. Laser beam 28 may comprise various configurations having different shapes, sizes, widths, etc. FIG. 1 depicts an exemplary flat laser beam 28 (i.e., a "fan") that, when projected onto shoe part 12, reflects a projected laser line 30 across a section of surface 14. The projected laser line 30 may also appear on shoe-part moving apparatus 16, depending on a width and angle of laser beam 28. For example, a section 31 of projected laser line 30 is depicted on shoe-part moving apparatus 16.

Laser 26 may comprise a laser line generator (e.g., laser micro line generator or laser macro line generator) having various features and capabilities. Exemplary features comprise an adjustable fan angle; homogenous intensity distribution; constant line width (i.e., thickness throughout whole measuring area); adjustable width; adjustable spectral range (e.g., 635 nm-980 nm); and adjustable power (e.g., up to 100 mW in the visible range and up to 105 mW in the IR range). In one aspect, laser 26 may have a fan angle of 40 degrees, a line length of 180 mm, a line width (i.e., thickness) of 0.108 mm, a working distance of 245 mm, a Rayleigh Range of 12 mm, a focusing range of 205-510 mm, and a convergence of 0.7 degrees.

Various aspects of laser 26 may be adjusted in coordination with shoe-part characteristics. For example, a color of laser beam 28 may be set or adjusted based on a color of shoe part 12. That is, certain combinations of laser-beam color and shoe-part color may allow the projected laser line 30 to be better recorded using camera 32. As such, the laser-beam color may be adjusted accordingly based on a shoe-part color.

Moreover, power levels of laser 26 may be adjusted based on a color of shoe part 12. For example, a single laser may have an adjustable power setting, such that the single laser may be adjusted based on shoe-part color. In another example, multiple lasers that have different power levels may be interchangeably utilized based on a color of shoe part 12. In a further example, multiple lasers may be arranged at a single station. In one aspect of the invention, a high-power laser may be utilized when projecting a beam onto a shoe part that is colored black (or is non-white). In a further aspect of the invention, a low-power laser may be utilized when projecting a beam onto a shoe part that is colored white. In a further aspect, multiple lasers may be used at the same time when a part is multi-colored. For example, both a high-power laser and a low-power laser may project respective beams onto a shoe part that is colored black and white. Camera 32 is positioned to record an image 34 of projected laser line 30, which extends across surface 14. As such, image 34 depicts a representation 36 and 38 of the projected laser line 30 as it appears reflected across shoe-part moving apparatus 16 and across shoe-part surface 14. That is, representation 36 depicts projected laser line 30 as it appears on shoe-part moving apparatus 16 and representation 38 depicts projected laser line 30 as it appears on shoe-part surface 14.

Camera 32 may have various features and characteristics. In an exemplary aspect, camera 32 may have a ½" progressive scan charge-coupled device ("CCD") that functions as a sensor. The camera 32 may be either monochrome and/or have color features (e.g., Bayer mosaic). In addition, camera 32 may have an adjustable frame rate (i.e., frames per second) that allows camera 32 to record a number of images in a given amount of time. For example, camera 32 may be able to record 31 frames per second. Other exemplary characteristics of camera 32 may be a chip size (e.g., 4.65 mm×4.65 mm), a number of pixels 1392×1040, a pixel size, sensitivity, etc.

Camera 32, laser 26, and shoe-part moving apparatus 16 may be cooperatively programmed to generate a plurality of images 41 of projected laser lines at various positions on shoe part surface 14. FIG. 1 depicts a plurality of images 41, some of which are depicted with broken lines for illustrative purposes. Each image of plurality 41 may depict a different representation of the projected laser line when the projected laser line appears on a different section of shoe-part surface 14. For example, shoe-part moving apparatus 16 may move shoe part 12 in the direction of either arrows 18 or 22 while laser 26 projects laser beam 28 onto shoe-part surface 14. Alternatively, laser 26 may be moved relative to shoe part surface 14, or both may be moved in a known fashion. A frames-per-second setting of camera 32 may be programmed to capture a plurality of images while shoe part 12 moves relative to laser 26 in the direction of arrow 18 or 22. Because shoe part 12 is being moved while laser beam 28 remains fixed, projected laser line 30 appears across different sections while the plurality of images are captured. As such, each of the plurality of images 41 may depict a different representation of the projected laser line 30 as it appears across a respective section of shoe part 12.

In another aspect, the settings of camera 32, laser 26, and shoe-part moving apparatus 16 are coordinated to record a number of images that are sufficient to derive desired shoe-part information. For example, camera 32 may be set to record about 31 frames per second and shoe-part moving apparatus 16 may be set to move about 20 mm per second. Under such parameters, an image may be recorded at about every 0.5 mm of the shoe part 12. However, in other aspects, the scan rate may be adjusted up or down based on the speed of shoe-part moving apparatus (and vice versa). Moreover, settings may be adjusted to record images at a distance apart that is less than 0.5 mm or greater than 0.5 mm.

Settings (e.g., aperture, shutter speed, etc.) of camera 34 may be adjusted, such that the representation 36 of projected laser line 30 is enhanced in image 34 relative to other portions of shoe part 12 that may be depicted in image 34. Moreover, settings of camera 34 and/or settings of laser 26 may be adjusted in a coordinated manner to capture images of projected laser lines that are of a sufficient quality to be analyzed. For example, settings may be adjusted to minimize blurring of the projected laser line both when projected across a shoe part and when depicted in an image. In a further aspect, system 10 may be set up in a vacuum chamber in order allow for more clear depictions of the projected laser lines to be captured. That is, in some environments, light scattering caused by white-colored shoe parts may result in an image having a less desirable quality. Arranging system 10 in a vacuum may reduce scattering caused by white-colored shoe parts.

In another aspect, settings are established based on a color of part 12 and a number of lasers that are used in system 10. For example, as described above, when a part is colored black and white, a low-power laser and a high-power laser may be utilized. In such an aspect, the camera scan rate may be doubled to record images of both the line created by the low-power laser and the line created by the high-power laser. In a further aspect, camera 34 may be used to sense a color of shoe part 12. As such, a power setting of laser 26 may be automatically adjusted based on a color of shoe part 12 that is sensed by camera 34. In the case where more than one camera is utilized, the settings on one of the cameras may be adjusted based on a first color of shoe part 12 (e.g., black) Likewise, the settings on another of the cameras may be adjusted based on a second color of shoe part 12 (e.g., white).

In a further aspect, system 10 may execute various operations to analyze images 41 captured by camera 32 and to combine dimension data derived therefrom. For example, system 10 may analyze image 34 to derive image coordinate points 40 and 42 of representations 36 and 38. Image coordinate points 40 and 42 may each be represented by a respective set of coordinate values relative to coordinate system 44. For example, the set of coordinate values may comprise a height element (e.g., Z of coordinate system 44) and a width element (e.g., Y of coordinate system 44), each of which is based on a coordinate system that defines image 34.

Moreover, the set of coordinate values that define points 40 and 42 may also comprise a depth value (e.g., X of coordinate system 44), which is relative to other images in the plurality 41 and may be determined based on a speed at which shoe-part moving apparatus 16 moves shoe part 12 and a frames-per-second setting of camera 32. For example, system 10 may be programmed to also determine a different set of coordinate values of coordinate point 46 of image 48. As such, the respective depth values of point 40 and 46 may be respective to one another based on a movement speed of shoe-part moving apparatus 16 and a frame-per-second rate of camera 32.

As depicted, representations 36 and 38 comprise multiple coordinate points, the coordinate values of which may all be determined to define representations 36 and 38 as depicted in image 34. Likewise, each of the other images of plurality 41 also may comprise respective multiple coordinate points. As such, system 10 may analyze each image of the plurality 41 to determine image coordinate values of respective coordinate points that define the representation in each image. The image coordinate values of all of the representations captured from images of shoe part 12 may be combined to create an image-coordinate-value set, which defines the entire shoe-part surface 14.

An image-coordinate-value set may be used in various ways. For example, an image-coordinate-value set may be used to render a 3-D model 50 of shoe-part surface 14. The 3-D model 50 may be based on various coordinate systems. That is, once conversions are determined, coordinate values derived from images 41 can be converted into a desired coordinate system. For example, as depicted in FIG. 1, 3-D model 50 is rendered in coordinate system 52, which may be part of a 3-D-image-rendering computer program. Such 3-D-image-rendering computer programs may build 3-D model 50 by, for example, using the coordinate values to construct a series of interlocking triangles that define the shoe-part surface 14. Further, a series of normal lines may be generated that are perpendicular to the surface of each of the triangles. These normal lines may be used, for instance, for determining a robot tool path. For example, spray adhesive may be applied parallel to the normal lines, and, by extension, perpendicular to the surface of the triangles that comprise the shoe-part surface 14.

Based on calibrations of camera 32, laser 26, and part-moving apparatus 16, coordinate values derived from images 41 may also be converted to a geometric coordinate system 54, which defines a space in which shoe part 12 is physically positioned. Moreover, geometric coordinate system 54 may further define a space in which automated shoe-part manufacturing tools operate, such that coordinate values derived from images 41 and converted to system 54 are useable to notify such tools of 3-D features of shoe part 12. For instance and as mentioned above, using the coordinate values, a robot tool path may be generated. Such robot tool paths may be useful for cutting, spraying adhesive or paint, stitching, attaching, lasering, molding, and the like.

Once values are derived from images 41, the dimension data may be used in various manners. For example, dimension data may be used to determine a size of a shoe part or a shape of a shoe part. In addition, dimension data may be used to analyze how a shoe part may be assembled with other shoe parts from which other dimension data has been derived. In another aspect, dimension data may be used to identify defects in a shoe part or to otherwise execute quality-control measures. Moreover, dimension data may be communicated to other shoe-manufacturing apparatuses and/or systems, to enable the apparatus or system to carry out a manufacturing function, such as cutting, attaching, stockfitting, stacking, etc.

As indicated, determining values of coordinate points may be based on calibrations that take into account relative positions and settings of camera 32, laser 26, and shoe-part moving apparatus 16. Positions of these elements in FIG. 1 are merely exemplary and are provided for illustrative purposes. As such, these elements may be arranged in other positions and arrangements, so long as the alternative positions and arrangements are taken into account when calibrating the system. For example, FIG. 1 depicts one camera 32 and one laser 26. However, system 10 may comprise more than one camera and more than one laser that capture the same or alternative aspects of shoe part 12. In addition, laser 26 is depicted perpendicular to shoe part 12 and shoe-part moving apparatus 16; however, laser 26 may also be arranged horizontal to shoe part 12 or at an angle above or below shoe part 12. Likewise, camera 32 may be positioned at various angles respective to projected laser line 30, so long as the angle is accounted for when calibrating the system 10.

In addition, system 10 may comprise computing device 60 that may help execute various operations, such as by analyzing images 41, determining coordinate values, and solving conversions. Computing device 60 may be a single device or multiple devices and may be physically integrated with the various elements of system 10 or may be physically distinct from the various elements. Computing device 60 may interact with one or more components of system 10 using any media and/or protocol. Further, computing device 60 may be located proximate or remote from components of system 10.

Various aspects of FIG. 1 have been described that may also be applicable to other systems described in this disclosure, such as systems depicted in FIGS. 2a, 2b, 3a, 3b, and 4. Accordingly, when describing these other systems, reference may also be made to FIG. 1 and aspects described in FIG. 1 may apply in these other systems.

Figure 2A:
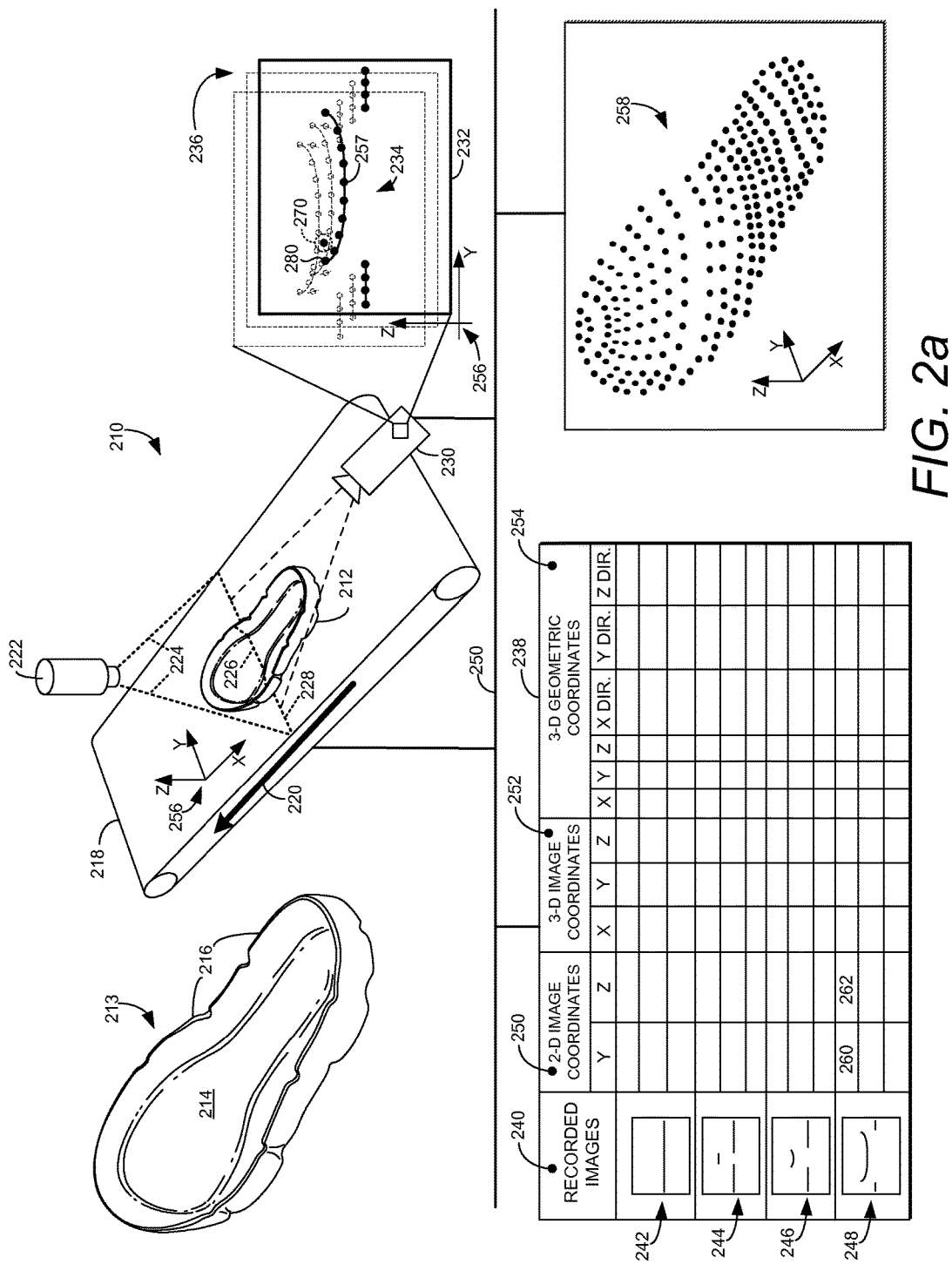

Referring now to FIG. 2a, an example of a system 210 is depicted that records and analyzes images of a shoe bottom 212, which is also shown in a larger view 213 for illustrative purposes. Shoe bottom 212 may comprise a shoe midsole, which may be attached to a shoe outsole (not shown) when assembled into a shoe. Surface 214 of shoe bottom 212 is depicted that may be an interior surface, which is coupled to a shoe upper. Side wall 216 protrudes around shoe bottom 212 and forms a perimeter of the interior surface 214, such that surface 214 may have a generally concave surface topography.

System 210 may have a conveyor 218 or other apparatus that retains and moves shoe bottom 212 in the direction of arrow 220. In addition, system 210 may comprise a laser 222 that projects a laser beam 224 onto surface 214 of shoe bottom 212 as conveyor 218 moves shoe bottom 212 in the direction of arrow 220. When laser beam 224 is projected onto surface 214, a projected laser line 226 appears across a section of shoe bottom 212, and a projected laser line 228 may also appear across a belt of conveyor 218.

System 210 may also have a camera 230 that records an image 232 of the projected laser lines 226 and 228, and image 232 may comprise a representation 234 depicting projected laser lines 226 and 228. Moreover, camera 230 may record a plurality of images 236 as conveyor 218 moves shoe part 212 in the direction of arrow 220. Each image of the plurality 236 depicts a respective representation of the projected laser line when the projected laser line extends across a respective section of shoe part 212.

Moreover, system 210 may have a computing device that maintains information depicted in table 238. Table 238 depicts a column of recorded images 240, such as images that are recorded by camera 230 as shoe part 212 is moved by conveyor 218. For example, image 242 depicts a representation of the projected laser line that is a straight line. Accordingly, image 242 may have been recorded before shoe part 212 was moved under laser beam 224, such that the projected laser line extends only across a belt of conveyor 218. However, images 244, 246, and 248 each depict respective representations of a projected laser line and may have been recorded at different instances in time when shoe part 212 was moving under laser beam 224. For example, image 232 may be stored as image 248 in table 238.

Table 238 also comprises various dimension data that may be derived from images 236, 242, 244, 246, and 248, such as 2-D image coordinates 250, 3-D image coordinates 252, and 3-D geometric coordinates 254. Two-dimensional image coordinates 250 may comprise coordinate values that define a coordinate point in a plane of an image. For example, coordinate values of an ordered set may define a height (e.g., Z) and a width (e.g., Y) based on coordinate system 256. As such, coordinate point 257 depicted in image 232 may be defined by values 260 and 262 stored in table 238. That is, values 260 and 262 are Y and Z values (respectively) for image 248. Accordingly, each of the coordinate points depicted in image 232 may be represented by coordinate values in table 238.

Moreover, ordered sets of 3-D image coordinates 252 may comprise a third coordinate value for depth (i.e., X), and as described with respect to FIG. 1, the depth value may be calculated based on various factors, such as a speed of conveyor 218 and a frame-per-second value of camera 230. Table 238 is merely shown for illustrative purposes and the information depicted therein in FIG. 2a may be stored or organized in various other ways. For example, 3-D image coordinates may be stored separate from other dimension data in a comma delimited text file (e.g., extension .xyz), which can be opened by a computer program (e.g., CAD program) to render a scan of surface 214.

Other exemplary dimension data of table 238 may be 3-D geometric coordinates 254, which are determined based on a conversion from 3-D image coordinates. Three-dimensional geometric coordinates 254 may represent a conversion into the physical space in which shoe part 212 is positioned. Moreover, 3-D coordinates 254 may be based on coordinate system 256 that defines a space in which shoe-manufacturing tools operate, such that 3-D coordinates are formatted to be communicated to automated shoe-manufacturing tools. As depicted in table 238, 3-D geometric coordinate values 254 comprise an X, Y, and Z, as well as respective directional information of each of the points. Three-dimensional geometric coordinates 254 may be generated using various techniques. For example, an .xyz file may be read by a conversion computer program to generate a file of 3-D geometric coordinates.

Based on a compilation of dimension data, such as 3-D image coordinates 252, 3-D geometric coordinates 254, or a combination thereof, a 3-D scan 258 may be built that depicts shoe part 212. Moreover, based on the compilation of dimension data, the position of shoe part 212, as well as the surface topography of surface 214, may be communicated to various shoe-manufacturing apparatuses. Once a position and surface topography are known by shoe-manufacturing tools, certain processes may be carried out in an automated fashion. For example, an adhesive may be applied to shoe bottom 212 in an automated manner following a robot tool path in order to attach shoe bottom 212 to a shoe upper.

When analyzing dimension data derived from images recorded by camera 230, some data may be filtered. For example, dimension data derived from image 242 may be filtered since image 242 may depict a representation of the projected laser line only extending across conveyor 218, and not across any portion of shoe bottom 212. Such filterable data may be identified using various analysis techniques, such as determining that all of the height values are close to zero value that is established based on a position of conveyor 218.

In addition, analysis of image 232 may generate other dimension data that is filterable. That is, image 232 depicts representation 270, which is encircled for explanatory purposes. Representation 270 illustrates a type of filterable noise that may sometimes be depicted in images as a result of camera settings and shoe-part colors. For example, when camera settings (e.g., relative aperture and shutter speed) are adjusted to a particular exposure, shoe parts that are all black can be scanned without creating undesirable noise. As such, this exposure setting is referred to herein as an "all-black-shoe exposure setting." However, when the all-black-shoe exposure setting is used to record an image of shoe part that is comprised of some white portions (e.g., an all-white-colored shoe part or a black-and-white-colored shoe part), noise similar to representation 270 appears in the image.

Noise depicted by representation 270 may be filtered by applying various techniques. For example, it may be assumed that if noise is going to appear in an image, the noise will be above and/or below a wanted or desired profile (i.e., a representation of the projected laser line as it appears across the shoe-part surface). As such, the noise may be mathematically filtered by removing coordinate points that have a same width value (e.g., Y), but have a higher and/or lower height value (e.g., Z) than adjacent coordinate points. For example, the coordinate point positioned along representation 270 may have a same Y value (width) as coordinate point 280; however, representation 270 will have a higher Z value (height) than a neighboring coordinate point (e.g., coordinate point 280). As such, the coordinate point along representation 270 may be filtered.

Noise may also be filtered applying other techniques. For example, a curve may be mathematically generated that best fits the various points depicted in image 232. For example, normal lines (lines perpendicular to the surface of shoe bottom 212) may be generated, and a curve may be mathematically generated that best fits the various normal lines. In an exemplary aspect, a least-squares-fitting method is applied to determine a best-fit curve. In addition, a parabolic function and/or Fourier series may be used as an approximating function in combination with the least-squares-fitting method. Once a best-fit curve has been determined, a distance of a coordinate from the best-fit curve is compared to a distance threshold. Coordinates that are greater than a threshold distance away from the best-fit curve may be filtered.

In addition, noise may be filtered by comparing distances between point and neighboring points to a threshold. For example, if a point is greater than a threshold distance (e.g., 0.2 mm) away from neighboring points, the point may be identified as noise and filtered. In another aspect, a number of coordinates that are allowed to be in a group (e.g., a group may be those coordinates depicted in image 232) may be capped, such that coordinates in excess of the cap are filtered. In another aspect a distance between points in a series may be measured (e.g., the distance between the (n)th coordinate and the (n+1)th coordinate) and compared to a threshold distance. If the distance between n and n+1 exceeds the threshold, then n+1 may be filtered as noise; however, if the distance between n and n+1 is below the threshold, n+1 may be kept.

FIG. 2c depicts another filtering step that may be used to further remove unwanted noise utilizing methods described above (e.g., the least-squares-fitting method using normal lines). FIG. 2c depicts an image 282 of a shoe bottom, such as shoe bottom 212. The image 282 is generated by compiling or "stitching together" multiple, cross-sectional laser scans 284 of the shoe bottom. Multiple, longitudinal virtual scans 286 are generated across the surface of the shoe bottom and are used to additionally filter unwanted noise. Although a finite number of cross-sectional laser scans 284 and longitudinal virtual scans 286 are depicted, it is contemplated that cross-sectional laser scans 284 and longitudinal virtual scans 286 may encompass any number of scans.

Figure 2B:
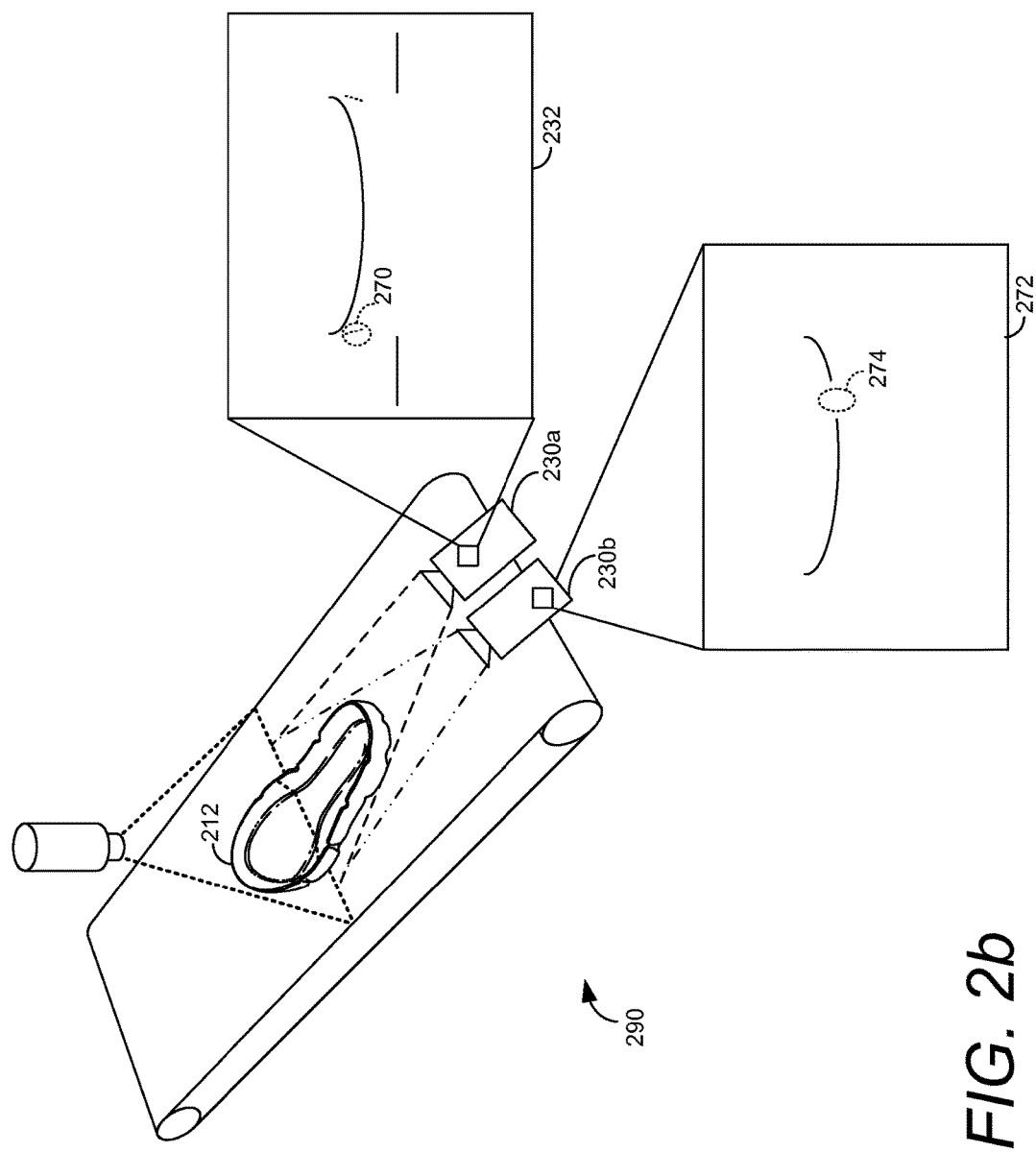

In addition, FIG. 2b depicts another approach that may be used to address noise depicted in representation 270 by arranging a system 290 that is modified from system 210. In system 290, cameras 230a and 230b may be installed side-by-side. Camera 230a may comprise an all-black-shoe exposure setting, such that if shoe part 212 is comprised of parts that are black and parts that are white, noise depicted by representation 270 may be created. Alternatively, camera 230b may be comprised of an all-white-shoe exposure setting, such that image 272 that is recorded does not depict noise. However, in image 272 black-colored portions of shoe part 212 are difficult to see and are encircled by 274 for illustrative purposes. Accordingly, by combining the proper line representations (e.g., the proper width values) from each of image 232 and 272 a complete 3D model of shoe part 212 may be built. To facilitate such a combining of lines, cameras 232a and 232b are installed side-by-side, each one having a respective setting (e.g., either all black or all white). Then cameras 232a and 232b record images at the same instance in time and the same frequency, such that data derived from the images may be combined.

Referring back to FIG. 2a components are depicted that communicate by way of a network 260. For example, while table 238 and scan 258 are depicted as being directly connected to the network 260, these elements may actually be maintained or rendered by one or more computing devices that communicate via network 260.

Moreover, while principles and components of FIG. 2a are described in a context of analyzing images of a shoe bottom, the same or similar principles and components may equally apply or be similarly used when analyzing images of other shoe parts. For example, the categories of dimension data depicted by table 238 may also be used to analyze images of other shoe parts, such as a shoe upper, or a combination of a shoe upper and a shoe bottom.

Figure 3A:
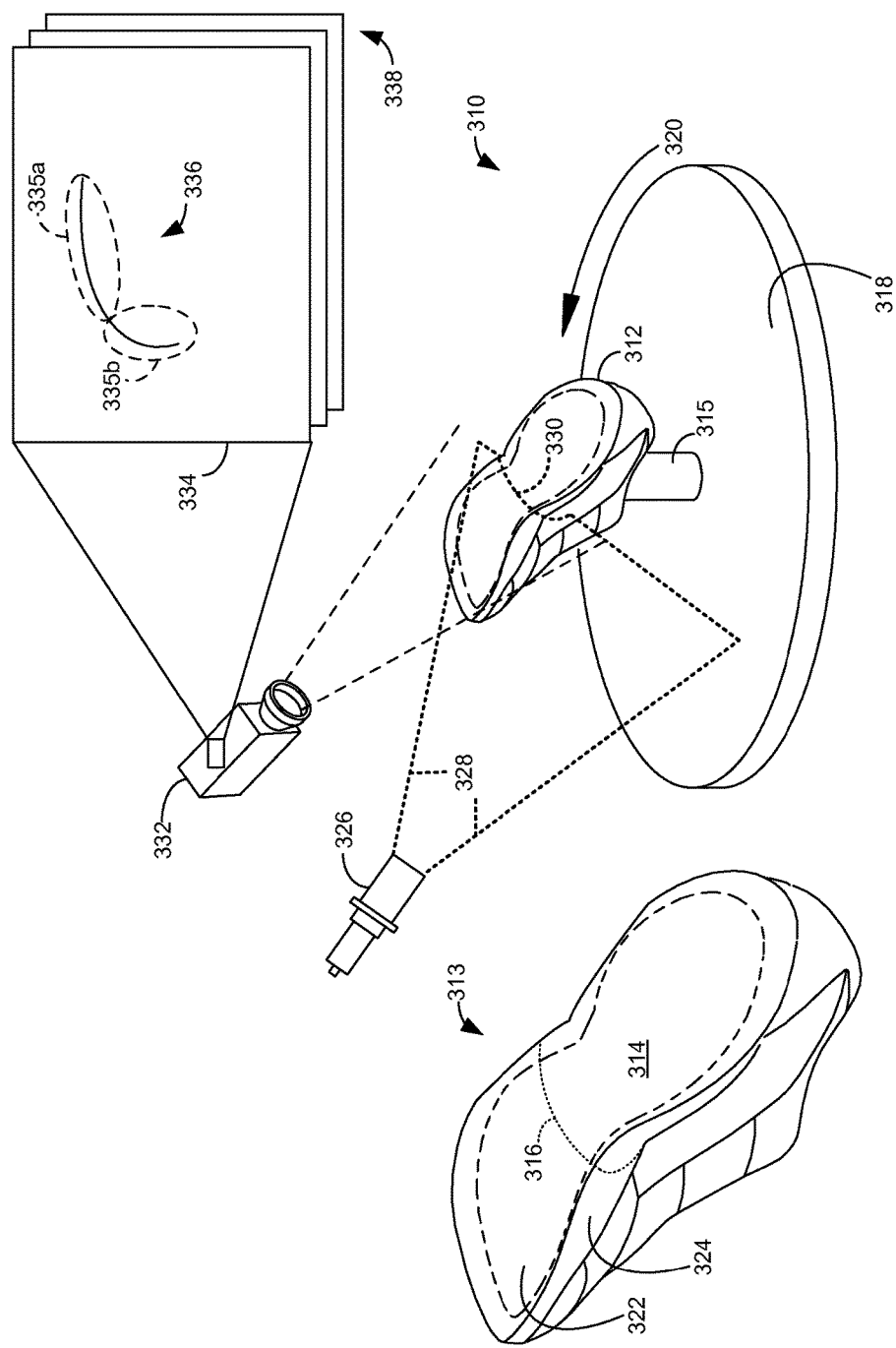
FIGS. 3a and 3b depict schematic diagrams of exemplary systems for automated 3-D modeling of a shoe upper.
Figure 3B:
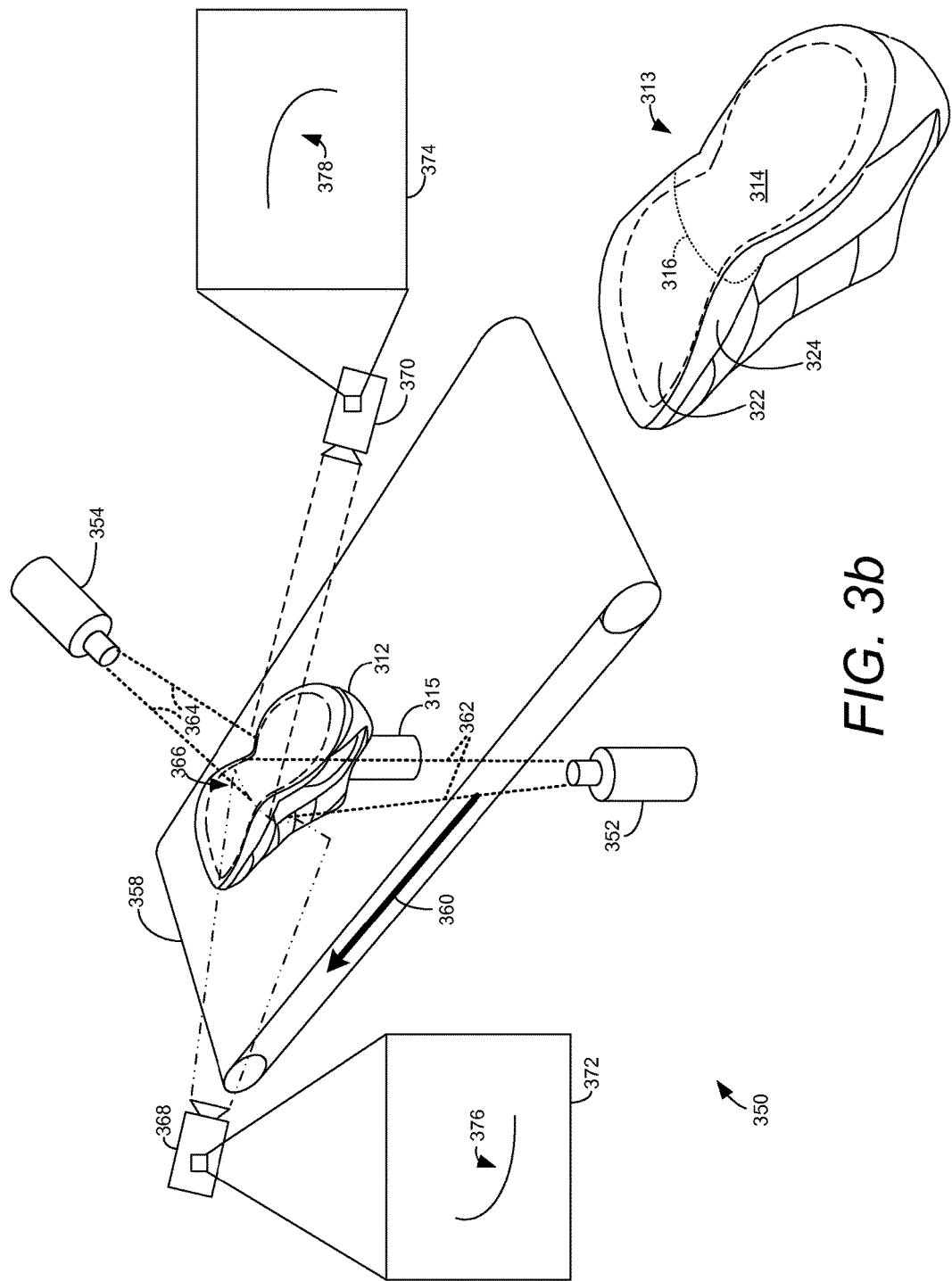

Referring now to FIGS. 3a and 3b, examples of other systems 310 and 350 are depicted that record and analyze images of a shoe upper 312, which is also shown in a larger view 313 for illustrative purposes. Shoe upper 312 may be lasted onto last 315. Shoe upper 312 may be attached to a shoe bottom (e.g., shoe bottom 212 of FIG. 2a) when assembled into a shoe. Surface 314 of shoe upper 312 is depicted that may be coupled to a shoe bottom. Surface 314 may be comprised of both a bottom wall 322 (which may be a strobel) of shoe upper 312, as well as at least a portion of a side wall 324. As such, surface 314 may have a generally convex surface topography, as depicted by illustrative line 316.

Similar to system 210, systems 310 and 350 may have an apparatus that retains and moves shoe upper 312, a laser that projects a laser beam onto shoe upper 312, and a camera that records images. However, because a bottom wall 322 of shoe upper 312 may be wider than a side wall 324, it may be desirable to position the laser in a nonperpendicular orientation. That is, if a laser were positioned perpendicular to bottom wall 322, the laser beam may only be projected onto the wider portion of surface 314 and may not reach a narrower portion of surface 314 along side wall 324. As such, FIGS. 3a and 3b depict exemplary systems in which one or more lasers are positioned in a nonperpendicular orientation with respect to bottom wall 322.

In FIG. 3a, system 310 may have a servo-motor-driven turntable 318 or other apparatus that retains and moves shoe upper 312 in the direction of arrow 320. In addition, system 310 may comprise a laser 326 that projects a laser beam 328 onto surface 314 of shoe upper 312 as turntable 318 moves shoe upper 312 in the direction of arrow 320. When laser beam 328 is projected onto surface 314, a projected laser line 330 appears across a section of shoe upper 312. FIG. 3a depicts that laser 326 may be angled relative to bottom wall 322, such that laser beam 328 may be projected onto both side wall 324 and bottom wall 322. However, when laser beam 328 is a flat beam, a plane of the flat beam may still extend perpendicularly even though laser 326 is angled.

System 310 may also have a camera 332 that records an image 334 of the projected laser line 330, and image 334 may comprise a representation 336 depicting projected laser line 330. As depicted, representation 336 depicts a portion 335a that represents projected laser line 330 as it appears across bottom wall 322 and a portion 335b that represents projected laser line 330 as it appears across side wall 324.

Moreover, camera 332 may record a plurality of images 338 as turntable 318 moves shoe upper 312 in the direction of arrow 320. Each image of the plurality of images 338 may depict a respective representation of the projected laser line when the projected laser line 330 extends across a respective section of shoe upper 312. Because turntable 318 may move shoe upper 312 in a 360-degree rotation, and laser beam 328 is projected onto both a side wall 324 and a bottom wall 322, representations depicted by the plurality of images may capture the projected laser line 330 reflected around the entire surface 314. Once the plurality of images have been recorded that represent a 360-degree profile of shoe upper 312, dimension data may be derived from the images as described with respect to FIGS. 1 and 2a.

Referring to FIG. 3b, another system 350 is depicted in which multiple lasers may be positioned in a nonperpendicular orientation with respect to bottom wall 322. System 350 may comprise a conveyor 358 or other apparatus that retains and moves shoe upper 312 in the direction of arrow 360. In addition, system 350 may comprise multiple lasers 352 and 354 that project laser beams 362 and 364 (respectively) onto different sections of surface 314 of shoe upper 312 as conveyor 358 moves shoe upper 312 in the direction of arrow 360. When describing system 350, beams 362 and 364 may be referred to a first laser beam and a second laser beam.

When laser beams 362 and 364 are projected onto surface 314, multiple projected laser lines appear across respective sections of shoe upper 312. FIG. 3b depicts that lasers 352 and 354 may be angled relative to bottom wall 322, such that laser beams 362 and 364 may be projected onto both side wall 324 and bottom wall 322. When laser beams 362 and 364 are flat beams, planes of the flat beams may still extend perpendicularly even though lasers 352 and 354 are angled. Lasers 352 and 354 may be positioned at different angles with respect to surface 314 (e.g., above and below surface 314) in order to generate dimension data. As well, lasers 352 and 354 may be positioned directly across from one another, such that when laser beams 362 and 364 are projected onto respective sections of surface 314, laser beams 362 and 364 may overlap. As such, a curtain of overlapping laser beams 366 may be formed that also extends perpendicular to a belt surface of conveyor 358.

System 350 may have multiple cameras 368 and 370 positioned to capture images 372 and 374 (respectively). Image 372 depicts a representation 376 of a projected laser line created by laser beam 362. On the other hand, image 374 depicts a representation 378 of a projected laser line created by laser beam 364. Moreover, cameras 368 and 370 may record a plurality of images shoe upper 312 is moved through a series of positions in the direction of arrow 360. Because laser beams 362 and 364 may be projected onto sections of both side wall 324 and bottom wall 322 that extend from a toe area to a heel area (i.e., as shoe upper 312 moves along the conveyor) representations depicted by the plurality of images may capture the entire surface 314. Once the plurality of images has been recorded, dimension data may be derived from the images as described with respect to FIGS. 1 and 2a. In addition, the dimension data derived from images of camera 368 may be combined with the dimension data derived from images of camera 370. In this respect, representations 376 and 378 are "stitched" together.

Figure 4:
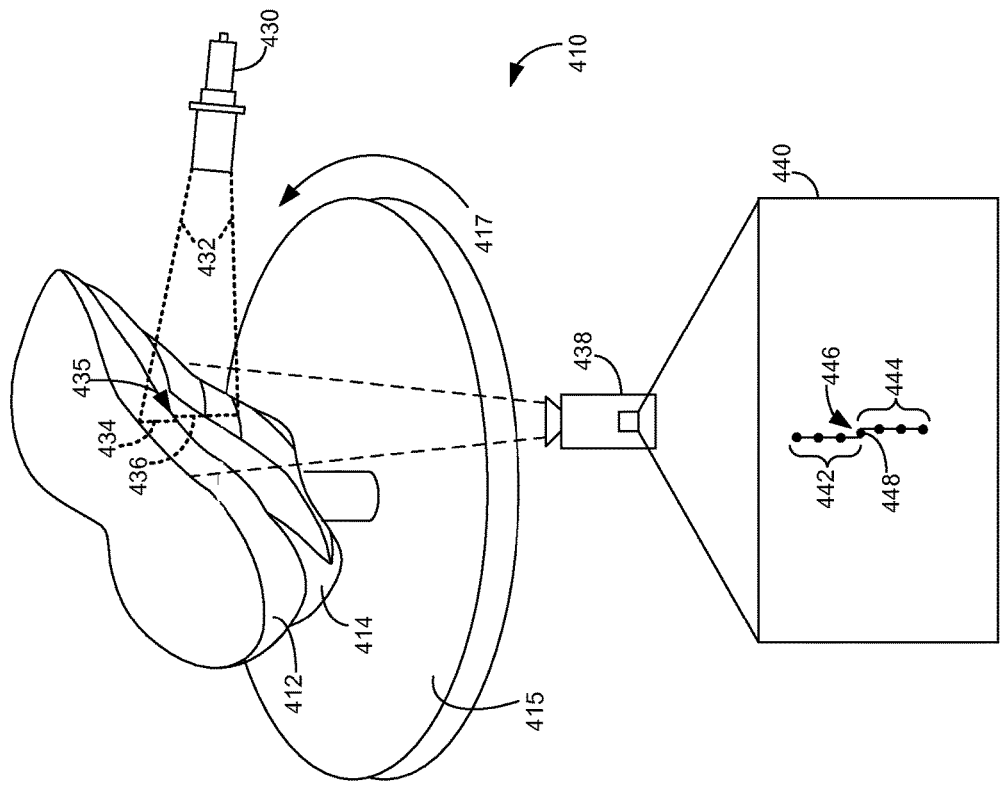
FIG. 4 depicts a schematic diagram of an exemplary system for 3-D modeling of a digital bite line.
Figure 4:
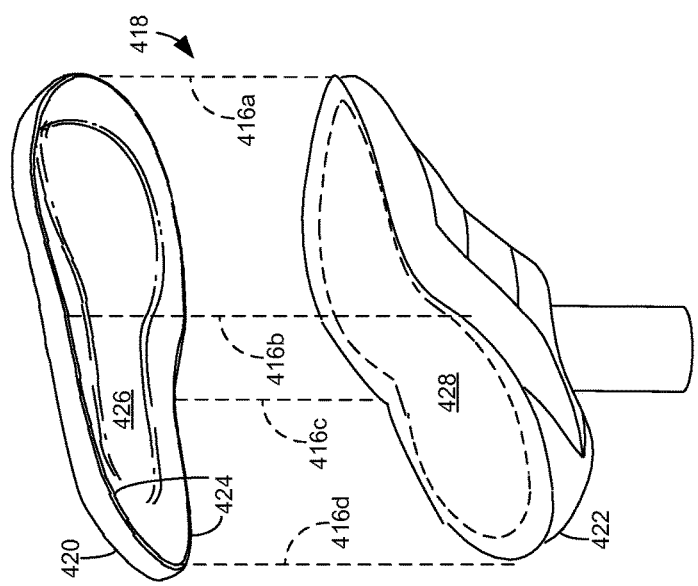

Referring to FIG. 4, an example of another system 410 is depicted that records and analyzes images of shoe parts, which may comprise a first shoe part fixed onto a second shoe part. For example, a first shoe part may be a shoe bottom 412 and a second shoe part may be a lasted shoe upper 414. Various temporary-attachment techniques or permanent-attachment techniques may be used to attach shoe bottom to shoe upper 414. For example, shoe bottom 412 may be temporarily attached to upper 414 using jigs. Moreover, shoe bottom 412 may be compressed against upper 414 by applying an amount of pressure that would be applied when shoe bottom 412 are upper 414 are attached in a more permanent fashion, such as when a shoe is constructed. For example, continuous pressure may be applied to simulate a position of part 412 with respect to part 414 when part 412 is attached to part 414 in a shoe construction. In one aspect, the amount of pressure applied may be approximately 30 kg/cm$^2$ or more.

Broken lines 416a-d are depicted in an exploded view 418 to illustrate a possible alignment of a shoe bottom 420 and lasted shoe upper 422 prior to attachment. Accordingly, shoe bottom 420 is comprised of a terminal edge 424 that forms a perimeter around surface 426. Surface 426 may abut surface 428 of shoe upper 422 when the shoe parts are assembled, such that terminal edge 424 may encircle shoe upper 422.

System 410 may have a servo-motor-driven turntable 415 or other apparatus that retains and moves the compressed assembly of shoe upper 414 and shoe bottom 412 in the direction of arrow 417. Alternatively, turntable 415 may comprise any apparatus that holds the compressed shoe upper 414 and shoe bottom 412 stationary while laser 430 and camera 438 rotate relative to shoe upper 414 and shoe bottom 412. System 410 also may comprise a laser 430 that horizontally projects a laser beam 432 onto a junction of shoe bottom 412 and shoe upper 414 while pressure is being applied, such that a first segment 434 of a projected laser line appears on shoe bottom 412 and a second segment 436 of the projected laser line appears on shoe upper 414. As previously described, a terminal edge of shoe bottom 412 encircles the lasted shoe upper 414, such that an outside surface of shoe bottom 412 may not be flush with an outside surface of shoe upper 414. Accordingly, first segment 434 may not be continuous with second segment 436, such as is depicted at junction 435.

System 410 may further comprise a camera 438 that records an image 440 of the first segment 434 and the second segment 436. As such, image 440 may comprise a first-segment representation 442 depicting first segment 434 and a second-segment representation 444 depicting second segment 436. FIG. 4 illustrates that an interface region 446 is represented in image 440 between first-segment representation 442 and second-segment representation 444. Interface region 446 may result from an outside surface of shoe bottom 412 not being flush with an outside surface of shoe upper 414, which may cause first segment 434 to be unaligned, misaligned, intersecting, or otherwise discontinuous with second segment 436.

System 410 may identify a coordinate point 448 that at least partially defines interface region 446. Moreover, by applying image analysis techniques described with respect to FIGS. 1 and 2a, system 410 may derive dimension data of the interface region, such as 3-D image coordinate values and 3-D geometric coordinate values. This derived information may be defined by system 410 as a "bite point" which identifies a digital point at which terminal edge 424 of shoe bottom 412 meets shoe upper 414 along one section of the assembly.

Moreover, camera 438 may record a plurality of images as turntable 415 moves in the direction of arrow 417. Each image of the plurality of images may depict a respective first-segment representation, a respective second-segment representation, and a respective interface portion. Accordingly, from all of the respective interface portions, system 410 may determine a digital bite point of each image. Because turntable 415 may move the assembly in a 360-degree rotation, system 410 may determine digital bite points around the entire interface between the shoe-bottom terminal edge and shoe upper 414. By combining all of the digital bite points, system 410 may derive a digital bite line.

A digital bite line represents a set of dimension data, which defines a position around a perimeter of a shoe upper that a shoe-bottom terminal edge will be aligned. A digital bite line may be used in various manners. For example, system 410 may update dimension data (e.g., 3-D geometric coordinates) that may be derived from systems 310 and 350 of FIGS. 3a-b and that may define a surface of a shoe upper. As such, dimension data that defines a surface topography of a shoe upper may also define a digital bite line that circumscribes the shoe-upper surface.

Moreover, the digital bite line may be communicated to shoe-manufacturing tools that execute various steps in a shoe-manufacturing process. For example, a digital bit line may help facilitate automated spraying, buffing, assembly, customization, and quality inspection of an area of shoe upper that falls below the digital bite line—i.e., in an area that will be covered by a shoe midsole or shoe bottom when the shoe is assembled.

A digital bite line may be generated by applying other techniques as well. For example, as indicated above, part 412 may be assembled onto part 414. In one aspect of the invention, a camera may record images as the assembly is rotated (or as the camera rotates around the assembly). As such, the camera may analyze the images by applying pattern recognition, color analysis, etc. to detect a bite point without requiring reflection of a projected laser line. The detected bite points may be combined to establish a bite line. The bite points and bite line may be correlated with a CAD program or other computer-assisted drawing application.

Figure 5:
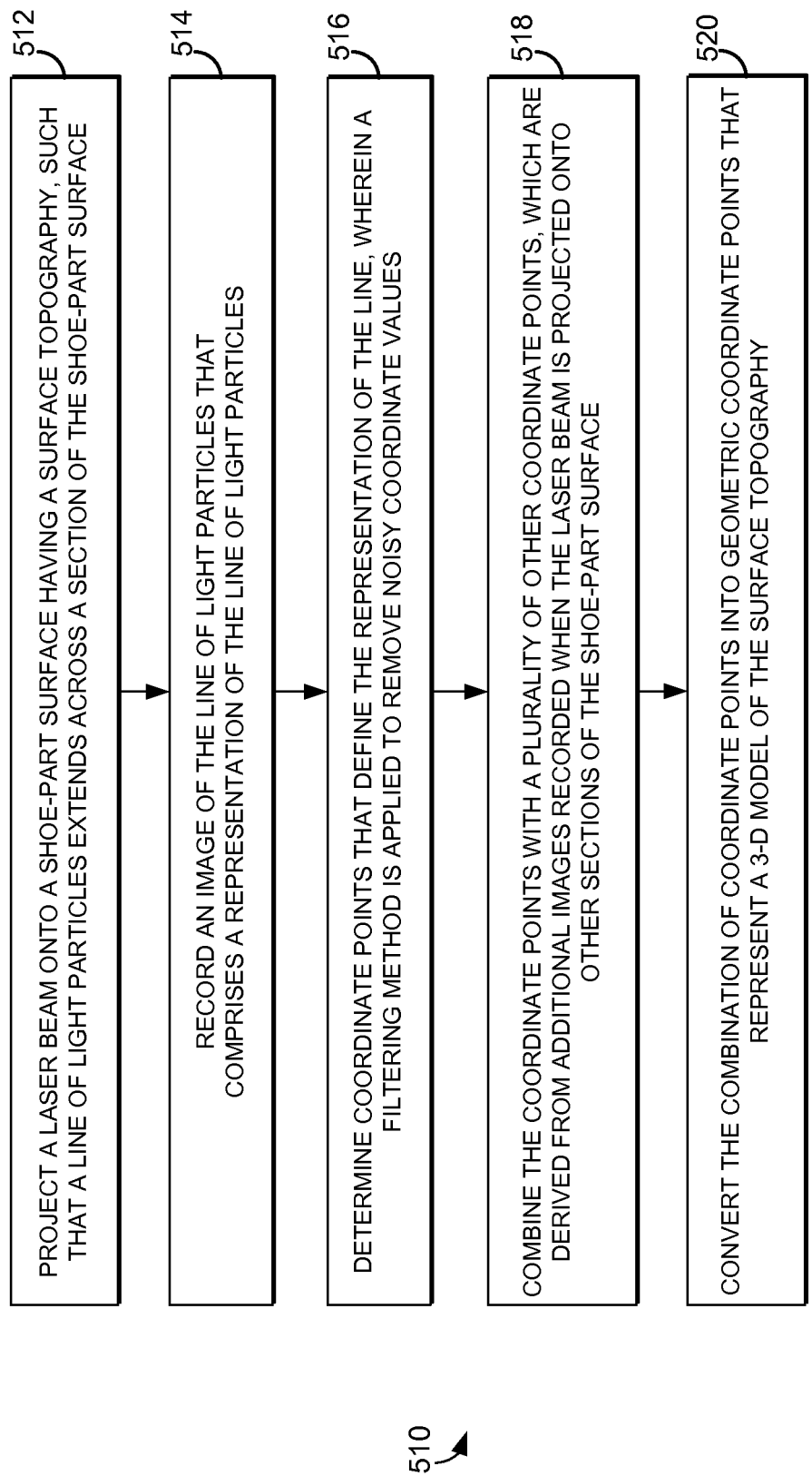
FIGS. 5 and 6 depict respective flow diagrams methods for analyzing an image of a shoe part.

Referring now to FIG. 5, a flow diagram is depicted of a method 510 for analyzing scans of a shoe part to generate dimension data, which is useable to model three-dimensional (3-D) features of the shoe part. In describing FIG. 5, reference is also be made to FIG. 1. In addition, method 510, or at least a portion thereof, may be carried out when a computing device executes a set of computer-executable instructions stored on computer storage media.

At step 512 a laser beam (e.g., 28) is projected onto a shoe-part surface (e.g., 14) of the shoe part (e.g., 12) that is comprised of a surface topography. Accordingly, a projected laser line (e.g., 30) may extend across a section of the shoe-part surface. Step 514 comprises recording an image (e.g., 34) of the projected laser line, and the image may depict a representation (e.g., 36) of the projected laser line. In addition, the image may depict an extraneous representation of light, such as a representation of light reflected off a shoe-part-moving apparatus or a representation of scattered light (e.g., 270 in FIGS. 2a and 2b). Furthermore, at step 516, coordinate points (e.g., 40) are determined that define the representation of the line as depicted in the image. When coordinate points are determined, a filtering method may be applied to remove noisy coordinate points. That is, as described above, noisy coordinate points may be generated representing a projected laser line that is not reflected across a portion of a shoe part that is of interest. For example, noisy coordinate points may be generated representing a projected laser line that extends across a shoe-part-moving apparatus and/or representing some light scattering (e.g., point 270). As such, one or more various filtering methods may be used to remove the noisy coordinate points. Exemplary filtering methods are described above, such as removing points that are greater than a threshold distance away from a best-fit curve, which is determined using a least-squares method. In another exemplary filtering method, coordinate values are deemed noisy when a coordinate height value is within a threshold distance of a zero value (i.e., fails to satisfy a height threshold). In addition, a point may be filtered when the point is greater than a threshold distance away from a neighboring point. These are merely exemplary filtering methods and a variety of other filtering methods may also be utilized.

Method 510 may also comprise, at step 518, combining the coordinate points with a plurality of other coordinate points (e.g., 46), which are derived from additional images (e.g., 41) recorded when the laser beam is projected onto other sections of the shoe-part surface. As such, a combination of coordinate points that represent the surface topography are compiled. Step 520 comprises converting the combination of coordinate points into geometric coordinate points that represent a 3-D model (e.g., 50) of the surface topography.

Figure 6:
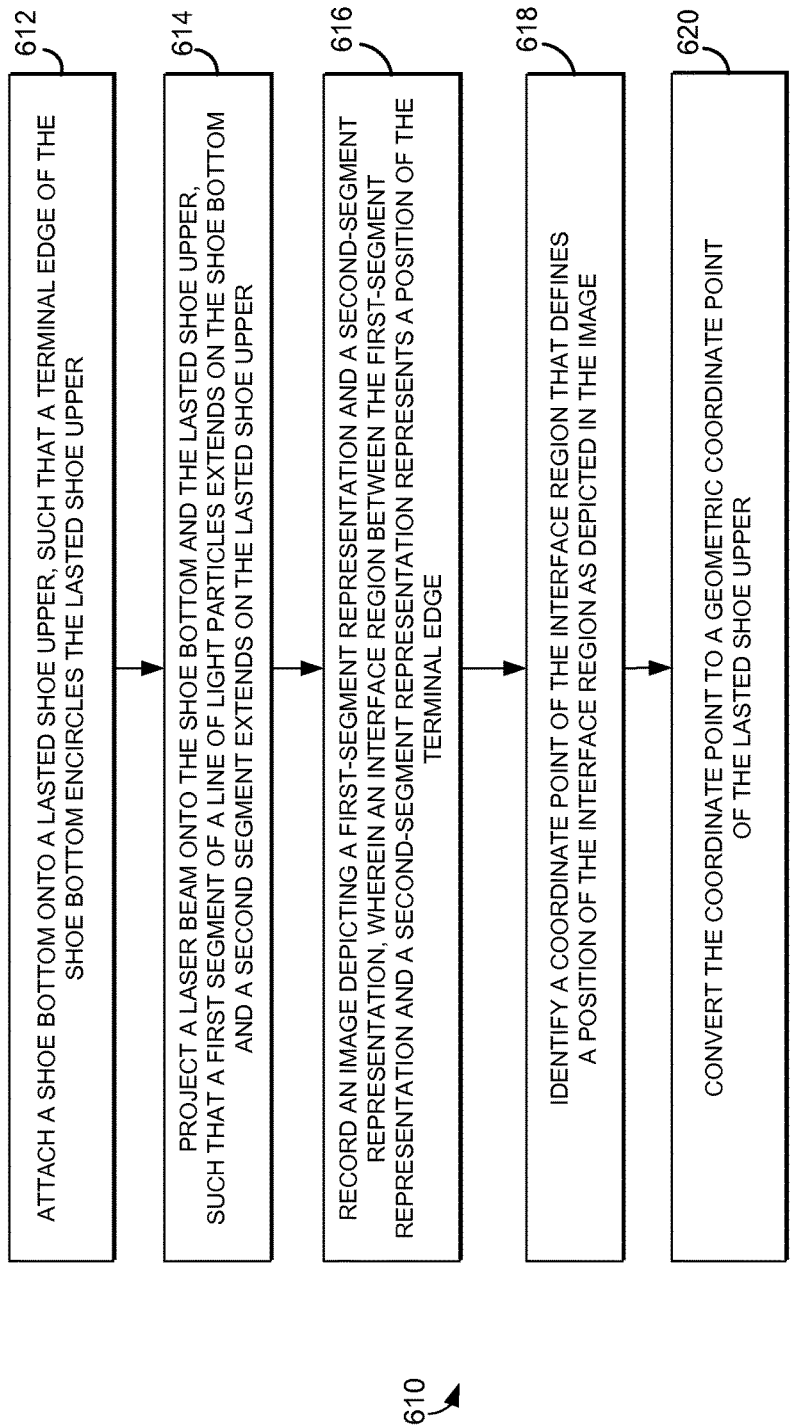

Referring now to FIG. 6, another flow diagram is depicted of a method 610 for analyzing scans of a shoe part to generate dimension data, which is useable to model three-dimensional (3-D) features of the shoe part. In describing FIG. 6, reference is also be made to FIGS. 3a and 4. In addition, method 610, or at least a portion thereof, may be carried out when a computing device executes a set of computer-executable instructions stored on computer storage media.

At step 612 a shoe bottom (e.g., 420) is attached onto a lasted shoe upper (e.g., 422), such that a terminal edge (e.g., 424) of the shoe bottom encircles the lasted shoe upper. Further, at step 614 a laser beam (e.g., 432) is projected onto the shoe bottom (e.g., 412) and the lasted shoe upper (e.g., 414). The laser beam is projected onto the shoe bottom and the lasted shoe upper when the two portions are compressed together. As such, a first segment (e.g., 434) of a projected laser line extends on the shoe bottom, and a second segment (e.g., 436) of the projected laser line extends on the lasted shoe upper.

Method 610 may also comprise, at step 616, recording an image (e.g., 440) of the projected laser lines that depicts a first-segment representation (e.g., 442) and a second-segment representation (e.g., 444). An interface region (e.g., 446) between the first-segment representation and a second-segment representation may represent a position of the terminal edge. At step 618, a coordinate point (e.g., 448) of the interface region is determined that defines a position of the interface region as depicted in the image. Furthermore, step 620 comprises converting the coordinate point (e.g., 448) to a geometric coordinate point of the lasted shoe upper (e.g., a geometric coordinate point derived from images 338). As such, the geometric coordinate point may be deemed a bite point that represents a position on the lasted shoe upper (e.g., 414) that is aligned with a portion of the terminal edge (e.g., 424).

FIGS. 4 and 6 are described with respect to a shoe upper and a shoe bottom (e.g., midsole and/or outsole); however, the methods that are used to describe FIGS. 4 and 6 may also be applied to other shoe parts that may also have parts that overlap to form an intersecting region. That is, a method similar to method 610 may be applied to a variety of different overlapping parts in order to derive a digital interface line at which two parts meet and/or overlap. For example, shoe upper assemblies may be constructed of multiple overlapping layers of material, and a method similar to method 610 may be applied to those overlapping layers to assist with alignment, quality control, part attachment, etc.

As described above, the present invention may comprise, among other things, a method, a system, or a set of instructions stored on one or more computer-readable media. Information stored on the computer-readable media may be used to direct operations of a computing device, and an exemplary computing device 700 is depicted in FIG. 7. Computing device 700 is but one example of a suitable computing system and is not intended to suggest any limitation as to the scope of use or functionality of invention aspects. Neither should the computing system 700 be interpreted as having any dependency or requirement relating to any one or combination of components illustrated. Moreover, aspects of the invention may also be practiced in distributed computing systems where tasks are performed by separate or remote-processing devices that are linked through a communications network.

Computing device 700 has a bus 710 that directly or indirectly couples the following components: memory 712, one or more processors 714, one or more presentation components 716, input/output ports 718, input/output components 720, and an illustrative power supply 722. Bus 710 represents what may be one or more busses (such as an address bus, data bus, or combination thereof). Although the various blocks of FIG. 7 are shown with lines for the sake of clarity, in reality, delineating various components is not so clear, and metaphorically, the lines would more accurately be grey and fuzzy. For example, processors may have memory.

Computing device 700 typically may have a variety of computer-readable media. By way of example, and not limitation, computer-readable media may comprises Random Access Memory (RAM); Read Only Memory (ROM); Electronically Erasable Programmable Read Only Memory (EEPROM); flash memory or other memory technologies; CDROM, digital versatile disks (DVD) or other optical or holographic media; magnetic cassettes, magnetic tape, magnetic disk storage or other magnetic storage devices, carrier wave or any other medium that can be used to encode desired information and be accessed by computing device 700.

Memory 712 is comprised of tangible computer-storage media in the form of volatile and/or nonvolatile memory. Memory 712 may be removable, nonremovable, or a combination thereof. Exemplary hardware devices are solid-state memory, hard drives, optical-disc drives, etc.

Computing device 700 is depicted to have one or more processors 714 that read data from various entities such as memory 712 or I/O components 720. Exemplary data that is read by a processor may be comprised of computer code or machine-useable instructions, which may be computer-executable instructions such as program modules, being executed by a computer or other machine. Generally, program modules such as routines, programs, objects, components, data structures, etc., refer to code that perform particular tasks or implement particular abstract data types.

Presentation component(s) 716 present data indications to a user or other device. Exemplary presentation components are a display device, speaker, printing component, light-emitting component, etc. I/O ports 718 allow computing device 700 to be logically coupled to other devices including I/O components 720, some of which may be built in.

In the context of shoe manufacturing, a computing device 700 may be used to determine operations of various shoe-manufacturing tools. For example, a computing device may be used to control a part-pickup tool or a conveyor that transfers shoe parts from one location to another. In addition, a computing device may be used to control a part-attachment device that attaches (e.g., welds, adheres, stitches, etc.) one shoe part to another shoe part.

Many different arrangements of the various components depicted, as well as components not shown, are possible without departing from the scope of the claims below. Aspects of our technology have been described with the intent to be illustrative rather than restrictive. Alternative aspects will become apparent to readers of this disclosure after and because of reading it. Alternative means of implementing the aforementioned can be completed without departing from the scope of the claims below. Certain features and subcombinations are of utility and may be employed without reference to other features and subcombinations and are contemplated within the scope of the claims.

The invention claimed is:

1. A method for analyzing scans of a shoe part to generate dimension data, which is useable to model three-dimensional (3-D) features of the shoe part, the method comprising:
    modifying a setting of a camera and/or a laser based on a color of the shoe part;
    projecting a laser beam from the laser onto a shoe-part surface of the shoe part, which is comprised of a surface topography, such that a projected laser line extends across at least a portion of the shoe-part surface;
    recording a first image of the projected laser line using the camera, wherein the first image comprises a first representation of the projected laser line;
    recording a second image of the projected laser line using the camera, wherein the second image comprises a second representation of the projected laser line;

determining a first set of coordinate points that define the first representation of the projected laser line from the first image;

determining a second set of coordinate points that define the second representation of the projected laser line from the second image;

combining the first and second sets of coordinate points to generate a combined set of coordinate points that represent at least a portion of the surface topography;

converting the combined set of coordinate points into a set of geometric coordinate points that represents a 3-D model of the at least a portion of the surface topography; and generating a tool path for a manufacturing process to be applied to the shoe-part surface, the tool path generated based at least in part on the 3-D model.

2. The method of claim 1, further comprising applying the manufacturing process to the shoe-part surface using a shoe-manufacturing tool based on the generated tool path, wherein the manufacturing process comprises at least one of:

adhesive-application, and buffing.

3. The method of claim 1, wherein modifying the setting of the camera and/or the laser comprises modifying an exposure setting of the camera based on the color of the shoe part.

4. The method of claim 1, wherein the shoe part comprises a midsole portion comprised of the shoe-part surface, and wherein the set of geometric coordinate points maps a concave surface topography.

5. The method of claim 1, wherein the shoe part comprises a lasted shoe upper comprised of the shoe-part surface in combination with a midsole portion, and wherein the set of geometric coordinate points maps a partially convex surface topography.

6. The method of claim 5, wherein the lasted shoe upper and the midsole portion are moved in a toe-to-heel or a heel-to-toe direction while the laser beam is projected.

7. The method of claim 1, further comprising:

projecting an additional laser beam onto the shoe-part surface, such that an additional projected laser line extends across at least a portion of the shoe-part surface;

recording an additional image of the additional projected laser line, wherein the additional image comprises a representation of the additional projected laser line;

determining an additional set of coordinate points that define the representation of the additional projected laser line; and combining the additional set of coordinate points with the first and second sets of coordinate points to generate the combined set of coordinate points.

8. The method of claim 1, wherein modifying the setting of the camera and/or the laser comprises adjusting a power level of the laser based on the color of the shoe part.

9. A method for analyzing scans of shoe parts to generate dimension data, which is useable to model three-dimensional (3-D) features of the shoe parts for use in generating tool paths, the method comprising:

positioning a first shoe part on at least a portion of a second shoe part, wherein an edge where the first shoe part meets the second shoe part comprises an interface line;

projecting a laser beam onto the first shoe part and the second shoe part such that a first segment of a projected laser line extends on the first shoe part and a second segment of the projected laser line extends on the second shoe part;

recording an image of the projected laser line that depicts a first-segment representation and a second-segment representation, wherein an interface region between the first-segment representation and the second-segment representation represents a portion of the interface line between the first shoe part and the second shoe part;

identifying a coordinate point of the interface region that defines a position of the interface region as depicted in the image;

converting the coordinate point to a geometric coordinate point that defines in part the interface line between the first shoe part and the second shoe part; and generating a tool path for a manufacturing process based at least in part on the interface line, the tool path generated so that the manufacturing process can be applied to an area of the first shoe part enclosed by the interface line that is to be covered by the second shoe part upon assembly of the first shoe part and the second shoe part.

10. The method of claim 9, wherein the first shoe part comprises a first portion of a shoe upper and the second shoe part comprises a second portion of the shoe upper.

11. The method of claim 10, wherein the shoe upper is lasted.

12. The method of claim 9, wherein the image of the projected laser line is recorded using a camera.

13. The method of claim 12, further comprising:

projecting additional laser beams onto the first shoe part and the second shoe part; and recording additional images of projected laser lines formed by the additional laser beams.

14. The method of claim 13, wherein the additional images are recorded by one or more other cameras.

15. The method of claim 14, wherein the one or more other cameras include at least a first camera positioned at an orientation directly opposite a second camera.

16. The method of claim 13, further comprising:

deriving a respective coordinate point from each image of the additional images; and converting each respective coordinate point to a respective geometric coordinate point that further define the interface line between the first shoe part and the second shoe part.

17. The method of claim 9, further comprising modifying a setting of a camera used to record the image and/or a laser used to project the laser beam based on a color of the first shoe part and/or the second shoe part.

18. The method of claim 9, further comprising applying the manufacturing process to the first shoe part using a shoe-manufacturing tool based on the generated tool path, wherein the manufacturing process comprises at least one of adhesive-application and buffing.

19. A system for analyzing scans of shoe parts to generate dimension data that is useable to model three-dimensional (3-D) features of the shoe parts for generating tool paths for automated shoe manufacturing processes, the system comprising:

a shoe-part moving apparatus that retains at least a first shoe part against a second shoe part and moves the first shoe part and the second shoe part in a line of travel, wherein the first shoe part is positioned such that an edge where the first shoe part meets the second shoe part comprises an interface line;

one or more lasers that project laser beams onto the first shoe part and the second shoe part, each of the one or more lasers positioned such that a first segment of a respective projected laser line extends on the first shoe part and a second segment of the respective projected laser line extends on the second shoe part;

at least a first camera and a second camera that record a plurality of images of the projected laser lines, wherein each one of the plurality of images depicts a first-segment representation and a second-segment representation, and wherein an interface region between the first-segment representation and the second-segment representation represents the interface line between the first shoe part and the second shoe part; and computer storage media having stored thereon computer-executable instructions that, when executed by a computing device, cause the computing device to:
  (1) derive coordinate points from the plurality of images that define a position of the interface region;
  (2) compile the coordinate points into a set of coordinate points;
  (3) convert the set of coordinate points into geometric coordinate points that define the interface line between the first shoe part and the second shoe part; and generate a tool path based at least in part on the geometric coordinate points that define the interface line, the tool path generated so that a manufacturing process can be applied to an area of the first shoe part enclosed by the interface line.

20. The system of claim 19, wherein the first camera is positioned in a directly opposite orientation to the second camera with respect to the line of travel.

21. The system of claim 19, wherein the shoe-part moving apparatus comprises a conveyor and wherein the line of travel is along a straight axis.

22. The system of claim 21, wherein the laser beams overlap one another, thereby creating an overlapping curtain, and wherein the overlapping curtain is perpendicular to a belt of the conveyor.

23. The system of claim 19, wherein the shoe-part moving apparatus comprises a turntable apparatus that rotates the first shoe part and the second shoe part by 360 degrees.

24. The system of claim 19, wherein the first camera and the second camera are configured such that one or more camera settings can be adjusted based on a color of the first shoe part and/or the second shoe part.

25. The system of claim 19, further comprising a shoe-manufacturing tool adapted to apply the manufacturing process to the first shoe part within the area enclosed by the interface line utilizing the generated tool path, wherein the manufacturing process comprises at least one of adhesive-application and buffing.

* * * * *